United States Patent
Tsai et al.

(10) Patent No.: US 10,468,469 B2
(45) Date of Patent: Nov. 5, 2019

(54) TRANSPARENT DISPLAY DEVICE WITH WALL STRUCTURE

(71) Applicants: Industrial Technology Research Institute, Hsinchu (TW); Intellectual Property Innovation Corporation, Hsinchu (TW)

(72) Inventors: Yi-Shou Tsai, Taipei (TW); Yu-Hsiang Tsai, Hsinchu County (TW); Chih-Chia Chang, Hsinchu County (TW); Kuan-Ting Chen, Yunlin County (TW); Kuang-Jung Chen, Hsinchu County (TW); Yu-Tang Tsai, New Taipei (TW)

(73) Assignees: Industrial Technology Research Institute, Hsinchu (TW); Intellectual Property Innovation Corporation, Hsinchu (TW)

( * ) Notice: Subject to any disclaimer, the term of this patent is extended or adjusted under 35 U.S.C. 154(b) by 0 days.

(21) Appl. No.: 15/937,883

(22) Filed: Mar. 28, 2018

(65) Prior Publication Data
US 2019/0058020 A1    Feb. 21, 2019

Related U.S. Application Data

(60) Provisional application No. 62/547,118, filed on Aug. 18, 2017.

(30) Foreign Application Priority Data

Nov. 16, 2017    (TW) .............................. 106139692 A

(51) Int. Cl.
*H01L 27/32*    (2006.01)
*H01L 51/52*    (2006.01)
(Continued)

(52) U.S. Cl.
CPC ........ *H01L 27/3246* (2013.01); *G06F 3/0412* (2013.01); *H01L 27/323* (2013.01);
(Continued)

(58) Field of Classification Search
CPC . H01L 27/32; H01L 27/3241; H01L 27/3244; H01L 27/3258; H01L 27/326;
(Continued)

(56) References Cited

U.S. PATENT DOCUMENTS

| 5,790,304 A | 8/1998 | Sanders et al. |
| 6,949,389 B2 | 9/2005 | Pichler et al. |

(Continued)

FOREIGN PATENT DOCUMENTS

| CN | 1665352 | 9/2005 |
| CN | 1877411 | 12/2006 |

(Continued)

OTHER PUBLICATIONS

"Office Action of Taiwan Counterpart Application", dated Feb. 23, 2018, p. 1-p. 3, in which the listed references were cited.
(Continued)

*Primary Examiner* — Darlene M Ritchie
(74) *Attorney, Agent, or Firm* — JCIPRNET

(57) ABSTRACT

A transparent display device including a substrate having a light emitting region and a light transmitting region, a light emitting element located in the light emitting region, a first wall structure having an undercut sidewall, a first top conductive pattern and a barrier multi-layer structure is provided. The first wall structure forms the boundary between the light emitting region and the light transmitting region and the light emitting element is located in the light emitting region surrounded by the first wall structure. The first top conductive pattern is disposed on the top surface of the first wall structure. The barrier multi-layer structure is
(Continued)

disposed on the light emitting element. The barrier multilayer structure includes a first barrier layer and a second barrier layer. An overlapping portion of the first barrier layer and the second barrier is located in the light emitting region surrounded by the first wall structure.

20 Claims, 22 Drawing Sheets

(51) Int. Cl.
    *G06F 3/041*     (2006.01)
    *G06F 3/044*     (2006.01)
(52) U.S. Cl.
    CPC ...... *H01L 27/3276* (2013.01); *H01L 51/5253* (2013.01); *G06F 3/044* (2013.01); *H01L 51/5225* (2013.01)
(58) Field of Classification Search
    CPC ............ H01L 27/3276; H01L 27/3246; H01L 27/323; H01L 2227/32; H01L 51/5203; H01L 51/5206; H01L 51/5209; H01L 51/5237; H01L 51/525; H01L 51/5253; H01L 51/5256; G09G 3/3208; G09G 3/3225; G02F 1/1333; G06F 3/044; G06F 3/0412
See application file for complete search history.

(56) References Cited

U.S. PATENT DOCUMENTS

| | | | |
|---|---|---|---|
| 7,074,501 | B2 | 7/2006 | Czeremuszkin et al. |
| 9,093,669 | B2 | 7/2015 | Park et al. |
| 9,349,780 | B2 * | 5/2016 | Kim ..................... H01L 27/3258 |
| 9,698,377 | B1 | 7/2017 | Wu et al. |
| 10,170,526 | B1 * | 1/2019 | Yang .................. H01L 27/3246 |
| 2003/0205845 | A1 | 11/2003 | Pichler et al. |
| 2006/0017375 | A1 * | 1/2006 | Noguchi ............. H01L 27/3246 313/504 |
| 2011/0132449 | A1 | 6/2011 | Ramadas et al. |
| 2012/0193816 | A1 | 8/2012 | Schmid et al. |
| 2012/0228603 | A1 * | 9/2012 | Nakamura ............ H01L 27/322 257/40 |
| 2013/0147851 | A1 * | 6/2013 | Yim ........................ H01L 27/32 345/690 |
| 2013/0153880 | A1 | 6/2013 | Yamamoto et al. |
| 2014/0179040 | A1 | 6/2014 | Ramadas et al. |
| 2014/0183479 | A1 * | 7/2014 | Park ....................... H01L 51/56 257/40 |
| 2015/0041791 | A1 * | 2/2015 | Lee ...................... H01L 27/3276 257/40 |
| 2015/0307750 | A1 | 10/2015 | Nishijima et al. |
| 2016/0372528 | A1 * | 12/2016 | Kamura ............. H01L 51/0096 |
| 2017/0062535 | A1 * | 3/2017 | Kim .................... H01L 51/5284 |
| 2017/0069696 | A1 * | 3/2017 | Kondo ................ H01L 27/3276 |
| 2017/0145249 | A1 | 5/2017 | Yun et al. |
| 2017/0261782 | A1 * | 9/2017 | Lee ......................... G02F 1/1334 |
| 2017/0262109 | A1 * | 9/2017 | Choi .................... G06F 3/0412 |
| 2017/0278901 | A1 * | 9/2017 | Kim .................... H01L 51/0097 |
| 2018/0083223 | A1 * | 3/2018 | Saito ................... H01L 51/5246 |
| 2018/0309079 | A1 * | 10/2018 | Matsumoto ......... H01L 51/5012 |
| 2018/0342707 | A1 * | 11/2018 | Lee ........................ H01L 51/56 |
| 2019/0044091 | A1 * | 2/2019 | Omata ................ H01L 27/3204 |

FOREIGN PATENT DOCUMENTS

| | | |
|---|---|---|
| CN | 101409215 | 4/2009 |
| CN | 102790095 | 11/2012 |
| CN | 105073406 | 6/2017 |
| TW | 200703671 | 1/2007 |
| TW | 201008768 | 3/2010 |
| TW | 201143503 | 12/2011 |
| TW | 201318161 | 5/2013 |
| TW | 201324888 | 6/2013 |
| TW | 201404601 | 2/2014 |
| TW | 201430909 | 8/2014 |
| TW | 201546215 | 12/2015 |

OTHER PUBLICATIONS

"Office Action of Taiwan Related Application, application No. 106145424", dated Aug. 24, 2018, p. 1-p. 6.
"Office Action of Taiwan Related Application, application No. 107107532", dated Sep. 18, 2018, p. 1-p. 4.

* cited by examiner

TRANSPARENT DISPLAY DEVICE WITH WALL STRUCTURE

CROSS-REFERENCE TO RELATED APPLICATION

This application claims the priority benefits of U.S. provisional application Ser. No. 62/547,118, filed on Aug. 18, 2017, and Taiwan application serial no. 106139692, filed on Nov. 16, 2017. The entirety of each of the above-mentioned patent applications is hereby incorporated by reference herein and made a part of this specification.

TECHNICAL FIELD

The disclosure is related to a transparent display device.

BACKGROUND

A transparent display device inherently has a certain degree of transparency, which not only can display information or a frame, but also allows user to see the background behind the display clearly. The transparent display device is adaptable for windows of buildings, windows of vehicles, shop windows and so on and thus has received a lot of attention.

If the transparency of transparent display device is too low, the user would observe existence of the display device, which makes the background behind the display device unlikely to be seen clearly. In addition, if the transparent display device needs to be equipped with touch sensing function, the transparency of transparent display device would become poor due to the electrode and wiring configured for touch sensing function. In view of the above, there is still a lot of improvements for transparent display device.

SUMMARY

According to an embodiment of the disclosure, a transparent display device may include a substrate, a light emitting element, a first wall structure, a first top conductive pattern and a barrier multi-layer structure. The substrate has a light emitting region and a light transmitting region. The light emitting element is disposed on the substrate and located in the light emitting region. The first wall structure is disposed on the substrate and has an undercut sidewall. The first wall structure forms the boundary between the light transmitting region and the light emitting region, and the light emitting element is located in the light emitting regions surrounded by the first wall structure. The first top conductive pattern is disposed on the top surface of the first wall structure. The barrier multi-layer structure is disposed on the light emitting element. The barrier multi-layer structure includes a first barrier layer and a second barrier layer. An overlap portion of the first barrier layer overlapping the second barrier is located within the light emitting region surrounded by the first wall structure.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DESCRIPTION OF EMBODIMENTS

Figure 1:
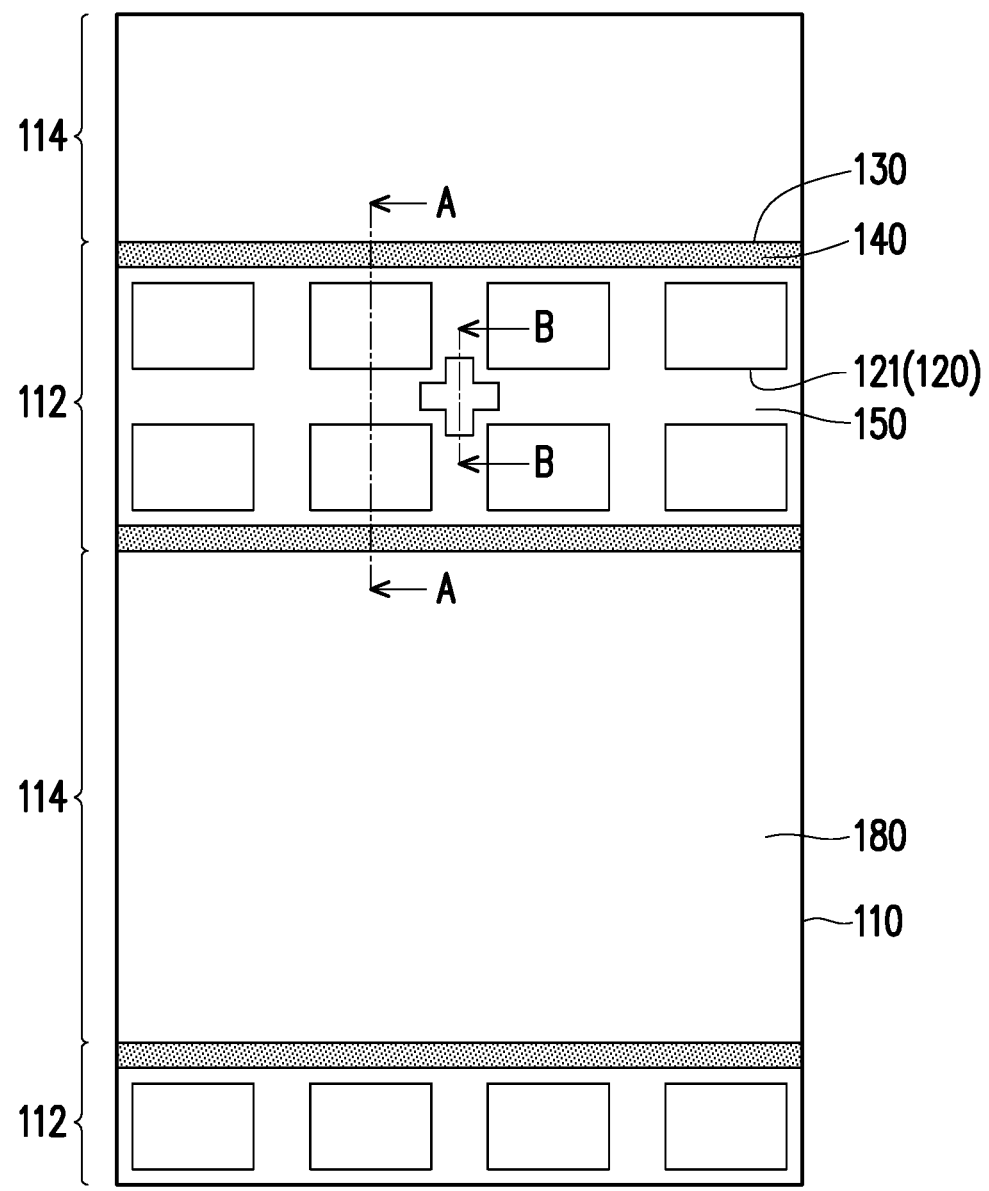
FIG. 1 is a top view of a portion of a transparent display device according to an embodiment of the disclosure.

In order to make the disclosure more comprehensible, embodiments are described below as the examples to prove that the disclosure can actually be realized. In addition, wherever possible, elements/components/steps denoted by the same reference numerals in drawings and embodiments represent the same or similar parts.

Figure 2:
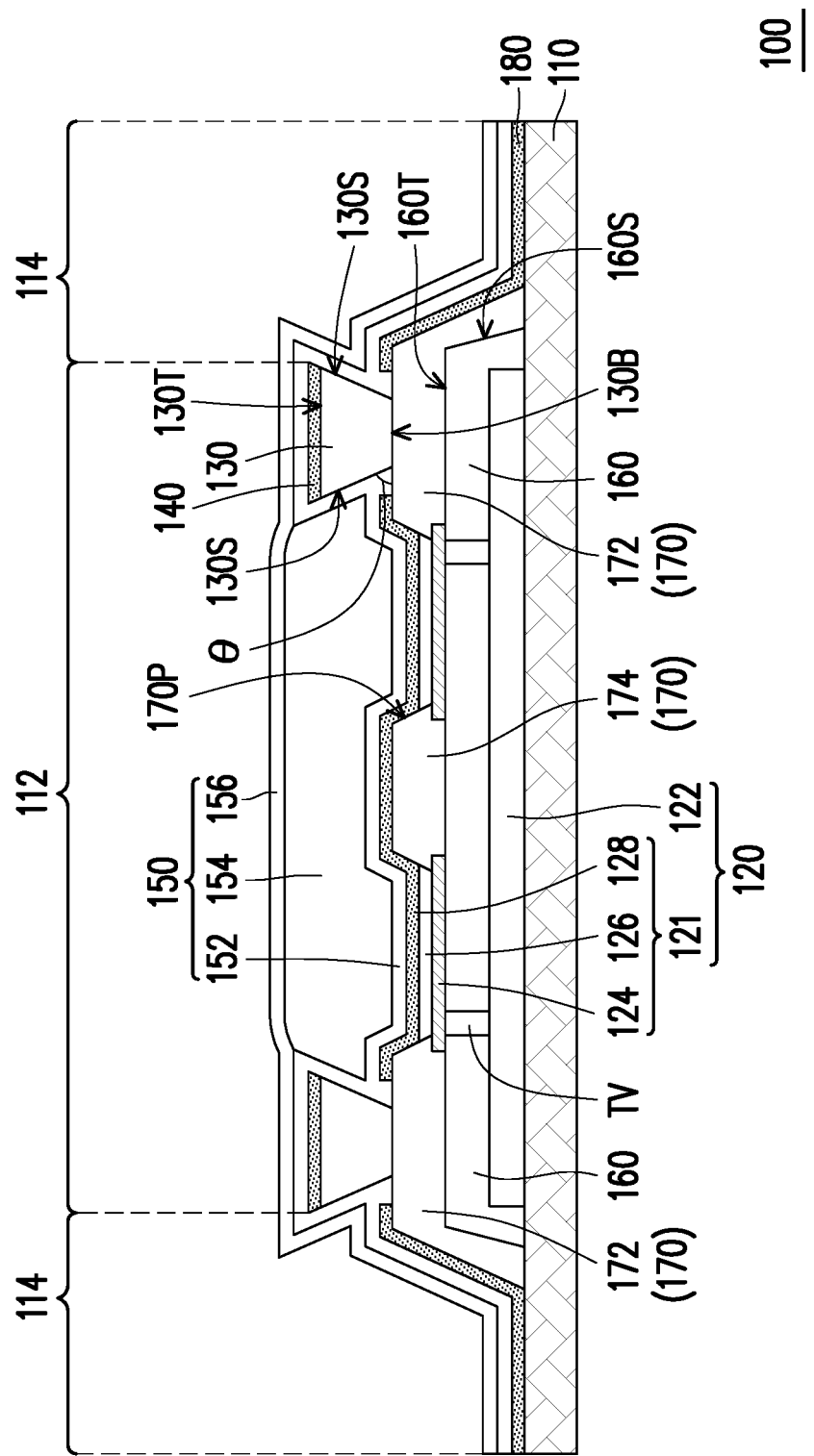
FIG. 2 is a cross-sectional view of a transparent display device according to an embodiment of the disclosure.

FIG. 1 is a top view of a portion of a transparent display device according to an embodiment of the disclosure. FIG. 1 shows that a transparent display device 100 includes a substrate 110, a light emitting element 120, a first wall structure 130 and a first top conductive pattern 140. The light emitting element 120 and the first wall structure 130 are disposed on the substrate 110. The first top conductive pattern 140 is disposed on a top surface of the first wall structure 130. The first top conductive pattern 140 in FIG. 1 and the first wall structure 130 are overlapped, and FIG. 1 is illustrated with fine dot pattern to represent the distribution area of the first top conductive pattern 140. The first wall structure 130 in FIG. 1 may surround the light emitting element 120, and the first wall structure 130 shown in FIG. 1 divides the substrate 110 into a light emitting region 112 and a light transmitting region 114 and defines the boundary between the light transmitting region 114 and the light emitting region 112. The light emitting element 120 is located in the light emitting region 112 and the light emitting region 112 is surrounded by the first wall structure 130. In another embodiment, the first wall structure 130 may include another portion disposed in the light transmitting region 114 or in the light emitting region 112 depending on different design requirements. Additionally, FIG. 1 exemplifies that the light emitting element 120 includes a plurality of organic light emitting structures 121; however, in other embodiments, the light emitting element 120 may include a single organic light emitting structure 121. One embodiment of the cross-section of the transparent display device in FIG. 1 taken along line A-A may be as shown in FIG. 2. Referring to both of FIG. 1 and FIG. 2, the transparent display device 100 further includes a barrier multi-layer structure 150, a planarization protecting layer 160, a pixel defining layer 170 and a light transmitting region conductive layer 180.

The substrate 110 may be a glass substrate, a plastic substrate or other plate-like structure that has light-transmitting property and provides sufficient support to support the light emitting element 120. The light emitting element 120 includes a driving circuit complex layer 122, a first electrode 124, a light emitting layer 126 and a second electrode 128. The driving circuit complex layer 122 is disposed on the substrate 110. The first electrode 124, the light emitting layer 126 and the second electrode 128 may be disposed on the driving circuit complex layer 122 in sequence. In the embodiment, in the first electrode 124 and the second electrode 128, the first electrode 124 is closer to the driving circuit complex layer 122 relative to the second electrode 128. The material of the light emitting layer 126 may include an organic light emitting material. A stacked structure of the first electrode 124, the light emitting layer 126 and the second electrode 128 may construct a light emitting diode, and the first electrode 124 may be regarded as anode and the second electrode 128 may be regarded as cathode. The driving circuit complex layer 122 may be constructed by a plurality of patterned conductive layers, a plurality of patterned insulating layers and at least one patterned semiconductor layer, and the above layers construct a circuit which may include an active element, a capacitor structure and so on that can drive the light emitting diode.

The planarization protecting layer 160 is disposed between the driving circuit complex layer 122 and the light emitting diode. The planarization protecting layer 160 may cover the driving circuit complex layer 122 and provide a planarization upper surface 160T such that the light emitting diode is disposed on the planarization upper surface 160T of the planarization protecting layer 160. Additionally, the driving circuit complex layer 122 and the first electrode 124 of the light emitting diode may be electrically connected together through a conductive via TV which penetrates through the planarization protecting layer 160.

FIG. 1 and FIG. 2 show that the pixel defining layer 170 defines a configuration area of the light emitting element 120, particularly the configuration area of the organic light emitting structure 121. The pixel defining layer 170 may include an outer periphery portion 172 and a separating portion 174. The outer periphery portion 172 is substantially distributed along the boundary between the light emitting region 112 and the light transmitting region 114, and the outer periphery portion 172 may cover a sidewall 160S of the planarization protective layer 160. The separating portion 174 is disposed in the light emitting region 112 to separate the plurality of organic light emitting structures 121 in the light emitting element 120. In terms of the present embodiment, the pixel defining layer 170 includes a plurality of pixel openings 170P such that the light emitting layer 126 of each organic light emitting structure 121 is disposed in one of the pixel openings 170P. In addition, the first electrodes 124 of the organic light emitting structures 121 are separated from each other at the separating portion 174 of the pixel defining layer 170 to independently drive the corresponding light emitting layers 126 in different pixel openings 170P. However, the second electrode 128 shared by the light emitting elements 120 may continuously cover the light emitting layers 126 of different organic light emitting structures 121, and also cover the pixel defining layer 170 so that the pixel defining layer 170 and the light emitting layers 126 are disposed between the second electrode 128 and the driving circuit complex layer 122. The separating portion 174 of the pixel defining layer 170 is completely covered by the second electrode 128.

The first wall structure 130 is disposed on the substrate 110 and has an undercut sidewall 130S. The first wall structure 130 may have a trapezoid width. The width is relatively narrow at a bottom surface 130B that is close to the substrate 110 and relatively wide at a top surface 130T that is further from the substrate 110, and has the undercut sidewall 130S. The first wall structure 130 is disposed on the pixel defining layer 170, and an undercut angle θ is formed between the undercut sidewall 130S of the first wall structure 130 and the pixel defining layer 170. In an embodiment, the undercut angle θ ranges from 30° to 65°.

The first top conductive pattern 140 is disposed on a top surface 130T of the first wall structure 130. In other words, the contour of the first top conductive pattern 140 is substantially aligned with that of the top surface 130T of the first wall structure 130.

FIG. 2 shows that the second electrode 128 of the plurality of light emitting elements 120 may be constructed by the same continuous conductive layer and become a common cathode. Additionally, the second electrode 128 of the light emitting element 120 and the first top conductive pattern 140 may be manufactured using the same conductive material via the same manufacturing step, and the second electrode 128 of the light emitting element 120 and the first top conductive pattern 140 are spaced apart from each other via the undercut sidewall 130S of the first wall structure 130. In the process of manufacturing the transparent display device 100, after the first wall structure 130 is fabricated, a thin film deposition technique and the like may be used to form the conductive layer for forming the second electrode 128 and the first top conductive pattern 140 on the substrate 110. Since the first wall structure 130 has the undercut sidewall 130S, when the thin film deposition process is carried out, the deposited conductive material cannot be continuously deposited on the undercut sidewall 130S of the first wall structure 130, and breaks off naturally at the edge of the top surface 130T of the first wall structure 130. Accordingly, the second electrode 128 and the first top conductive pattern 140 that are separated from each other can be formed without an additional patterning step. Moreover, when the second electrode 128 and the first top conductive pattern 140 are fabricated via the thin film deposition technique, the conductive material may be deposited in the light transmitting region 114 to form the light transmitting region conductive layer 180 in the light transmitting region 114. The first wall structure 130 also has the undercut sidewall 130S on a side near the light transmitting region 114. Accordingly, the light transmitting region conductive layer 180 may be separated from the first top conductive pattern 140.

In the embodiment, the barrier multi-layer structure 150 is disposed on the light emitting element 120 and located in the light emitting region 112 surrounded by the first wall structure 130. The area of the barrier multi-layer structure 150 is substantially located within the light emitting region 112 surrounded by the first wall structure 130. The barrier multi-layer structure 150 in FIG. 1 may overlap the light emitting element 120, and even substantially overlap the entire light emitting region 112 without extending into the light transmitting region 114.

The barrier multi-layer structure 150 includes a plurality of layers formed of different materials stacked together. In terms of the present embodiment, the barrier multi-layer structure 150 includes a first barrier layer 152, a second barrier layer 154 and a third barrier layer 156 stacked on the substrate 110 in sequence. That is, the second barrier layer 154 is sandwiched between the first barrier layer 152 and the third barrier layer 156. The materials of the first barrier layer 152, the second barrier layer 154 and the third barrier layer 156 may be an inorganic material, an organic material and an inorganic material respectively, wherein the inorganic material includes inorganic insulating material such as silicon nitride, silicon oxide, silicon oxynitride or the like, and organic material includes organic insulating material. However, the material of the first barrier layer 152, the second barrier layer 154 and the third barrier layer 156 may not be limited thereto. In other embodiments, the material of the second barrier layer 154 is different from the materials of the first barrier layer 152 and the third barrier layer 156, and the multi-layered structure stacked by the first barrier layer 152, the second barrier layer 154 and the third barrier layer 156 can serve the function of blocking moisture and/or oxygen.

The first barrier layer 152 in the barrier multi-layer structure 150 is a layer that is closer to the substrate 110. The first barrier layer 152 may be fabricated via an isotropic manufacturing process. The first barrier layer 152 may be continuously extended into the light transmitting region 114 from the light emitting region 112. In other words, the first barrier layer 152 continuously covers the second electrode 128, a portion of the pixel defining layer 170 under the undercut sidewall 130S of the first wall structure 130, the undercut sidewall 130S of the first wall structure 130 located in the light emitting region 112, the first top conductive pattern 140, the undercut sidewall 130S of the first wall structure 130 located in the light transmitting region 114 and the light transmitting region conductive layer 180 located in the light transmitting region 114.

The second barrier layer 154 may be disposed in the light emitting region 112 surrounded by the first wall structure 130, and the second barrier layer 154 may be disposed in the light emitting region 112 without being disposed in the light transmitting region 114. In this manner, the visible light passing through the light transmitting region 114 may not be affected by the material of the second barrier layer 154, which facilitates the improvement on the visible light transmittance of the transparent display device 100.

The third barrier layer 156 is a layer formed after the second barrier layer 154 is formed. The third barrier layer 156 may also be manufactured via the isotropic manufacturing process so that the third barrier layer 156 is also continuously extended into the light transmitting region 114 except for covering the second barrier layer 154 in the light emitting region 112. In terms of the present embodiment, the second barrier layer 154 is located in the region surrounded by the first wall structure 130, the third barrier layer 156 is in contact with the first barrier layer 152 outside the second barrier layer 154 to form a structure through which the first barrier layer 152 and the third barrier layer 156 completely encase the second barrier layer 154. In FIG. 2, the upper surface of the second barrier layer 154 may have a lens-like surface, which should not be construed as a limitation to the disclosure.

In the embodiment, the first barrier layer 152 and the third barrier layer 156 continuously cover the light emitting region 112 and the light transmitting region 114, the second barrier layer 154 is located in the light emitting region 112. An overlapping portion of the first barrier layer 152, the second barrier layer 154 and the third barrier layer 156 may provide good moisture and/or oxygen-resistance characteristic in the light emitting region 112 to avoid or slow down occurrence that the light emitting layer 126 is damaged or degenerated due to the moisture and/or oxygen from the outside. In the embodiment, there is no second barrier layer 154 in the light transmitting region 114, which facilitates the improvement on the visible light transmittance of the transparent display device 100 in the light transmitting region 114 so that the transparency of the transparent display device 100 may be enhanced. Additionally, the light transmitting region conductive layer 180 is located in the light transmitting region 114. The undercut sidewall 130S of the first wall structure 130 also allows the second electrode 128 of the light emitting element 120 to be connected with the light transmitting region conductive layer 180 in the light transmitting region 114. When the light transmitting region conductive layer 180 in the light transmitting region 114 is damaged or degenerated due to the moisture and/or oxygen from the lateral side, the portion that is damaged or degenerated is not extended into the second electrode 128 to ensure the service life of the second electrode 128 is not affected.

Figure 3:
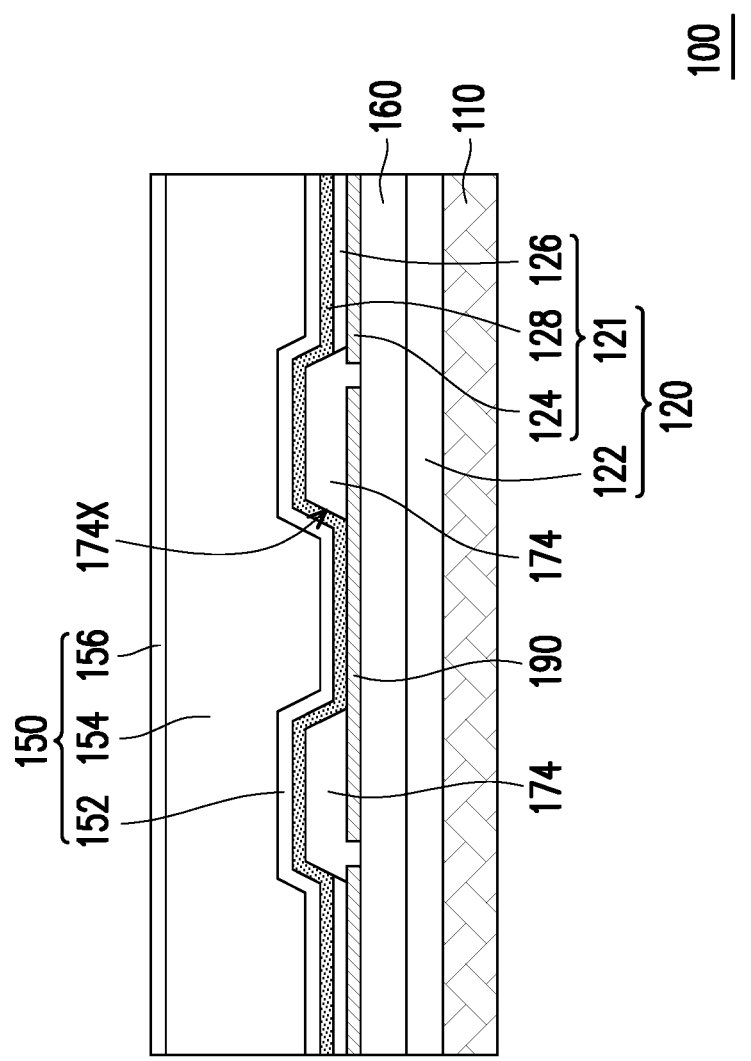
FIG. 3 is a cross-sectional view of a transparent display device according to an embodiment of the disclosure.

FIG. 3 is a cross-sectional view of the transparent display device in FIG. 1 taken along line B-B. Referring to both of FIG. 1 and FIG. 3, the transparent display device 100 may further include a second electrode transmission line 190 which transmits a signal of the second electrode 128. The second electrode transmission line 190 may be formed by the same conductive layer as the first electrode 124 and disposed between the pixel defining layer 170 and the planarization protecting layer 160. The separating portion 174 of the pixel defining layer 170 may have a conductive via 174X located in the light emitting region 112. The conductive via 174X may be disposed in corresponding to the second electrode transmission line 190, and the second electrode 128 may be filled into the conductive via 174X so that the second electrode 128 and the second electrode transmission line 190 are electrically connected in the conductive via 174X. In this manner, although the second electrode 128 is disposed within the region surrounded by the first wall structure 130 and is not connected with the light transmitting region conductive layer 180 in the light transmitting region 114, the second electrode 128 can be connected with a corresponding driving circuit through the configuration of the conductive via 174X and the second electrode transmission line 190.

Figure 4:
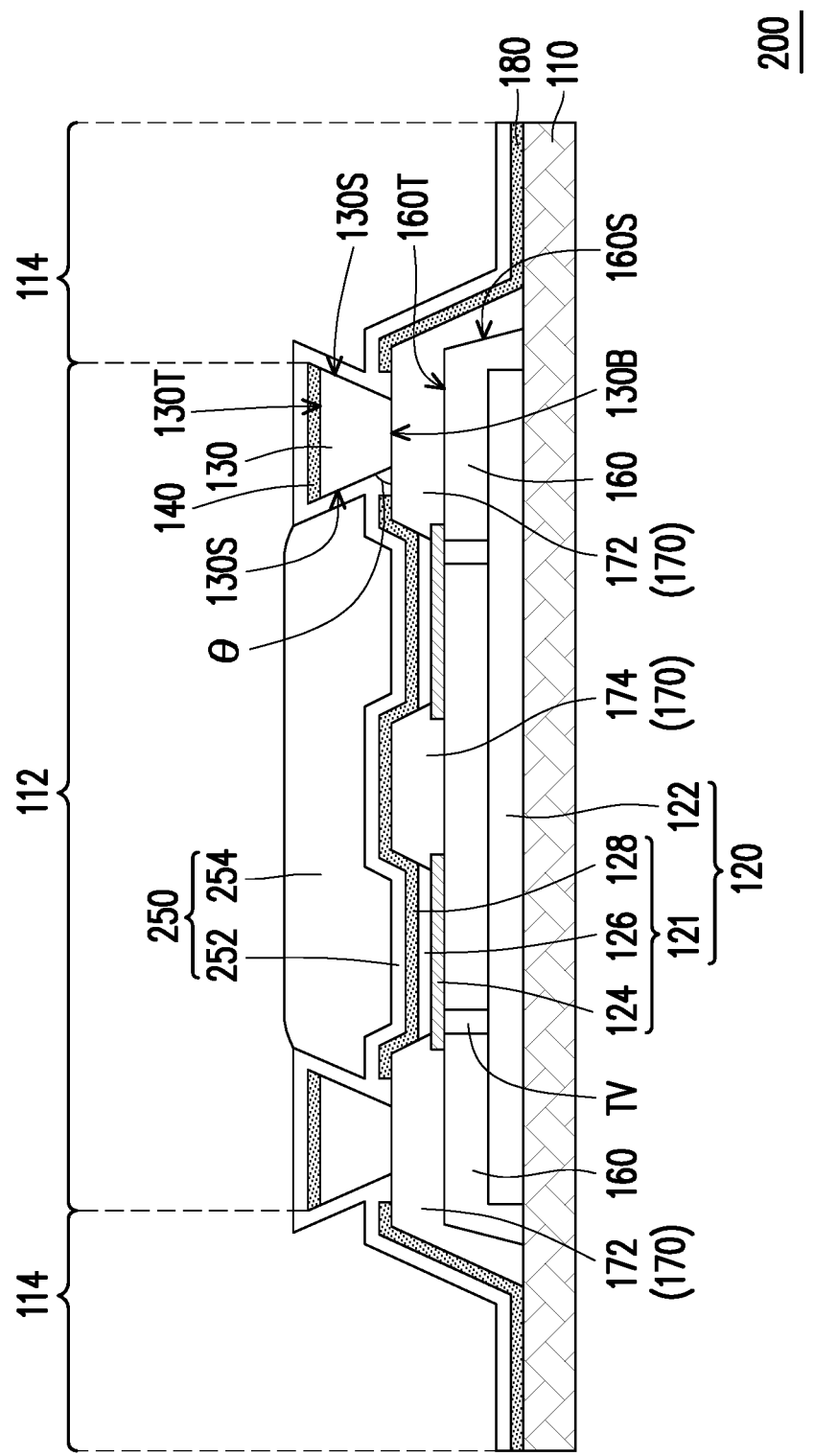
FIG. 4 is a cross-sectional view of a transparent display device according to another embodiment of the disclosure.

FIG. 4 is a cross-sectional view of a transparent display device according to another embodiment of the disclosure. Referring to FIG. 4, a transparent display device 200 is substantially similar to the transparent display device 100 in FIG. 2; therefore, the same or similar reference numerals in the two embodiments represent the same or similar elements. The transparent display device 200 may include a substrate 110, a light emitting element 120, a first wall structure 130, a first top conductive pattern 140, a barrier multi-layer structure 250, a planarization protecting layer 160, a pixel defining layer 170 and a light transmitting region conductive layer 180. Here, the previous embodiment may serve as reference to facilitate understanding of the configuration, structure and material of the substrate 110, the light emitting element 120, the first wall structure 130, the first top conductive pattern 140, the planarization protecting layer 160, the pixel defining layer 170 and the light transmitting region conductive layer 180; the related descriptions are not reiterated herein. Additionally, the barrier multi-layer structure 250 in the embodiment includes a first barrier layer 252 and a second barrier layer 254, which is different from the design of the embodiment in FIG. 2 which uses three barrier layers.

The first barrier layer 252 and the second barrier layer 254 may be formed of different materials. In some embodiments, the first barrier layer 252 may be an inorganic material layer such as silicon oxide, silicon nitride, silicon oxynitride and so on. The first barrier layer 252 may be manufactured via an isotropic manufacturing process. The first barrier layer 252 may be continuously extended into the light transmitting region 114 from the light emitting region 112 where the light emitting element 120 is located, and continuously cover the first wall structure 130. The second barrier layer 254 may be formed of a coating-type barrier material. The coating-type barrier material is, for example, a gel-state or liquid-state material containing silicon, nitrogen and oxygen. A method for manufacturing the second barrier layer 254 includes forming the coating-type barrier material in the light emitting region 112 surrounded by the first wall structure 130 via coating or dispensing. Thereafter, the coating-type barrier material is dried and cured to form the second barrier layer 254 in the light emitting region 112. The second barrier layer 254 is formed in the light emitting region 112; the overlapping portion where the first barrier layer 252 overlaps the second barrier layer 254 is also located in the light emitting region 112 surrounded by the first wall structure 130. In this manner, the transparent display device 200 in the light transmitting region 114 can have good visible light-transmitting property in the absence of the second barrier layer 254, and have good moisture and/or oxygen resistance property in the light emitting region 112.

Figure 5:
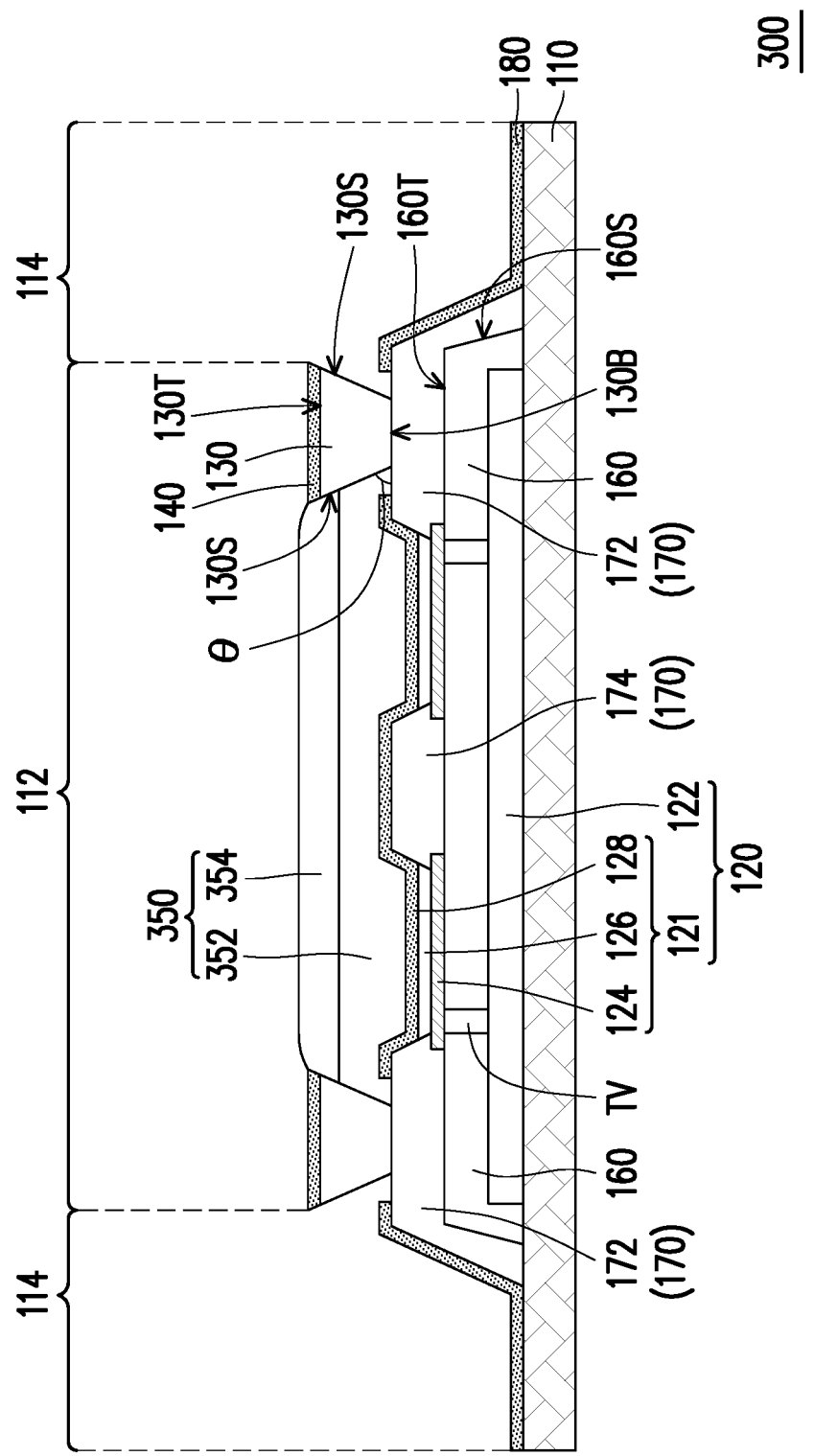
FIG. 5 is a cross-sectional view of a transparent display device according to still another embodiment of the disclosure.

FIG. 5 is a cross-sectional view of a transparent display device according to still another embodiment of the disclosure. Referring to FIG. 5, a transparent display device 300 is substantially similar to the transparent display device 100 in FIG. 2; thus, the same or similar reference numerals in the two embodiments represent the same or similar elements. The transparent display device 300 includes a substrate 110, a light emitting element 120, a first wall structure 130, a first top conductive pattern 140, a barrier multi-layer structure 350, a planarization protecting layer 160, a pixel defining layer 170 and a light transmitting region conductive layer 180. Here, the previous embodiment may serve as reference to facilitate understanding of the configuration, structure and material of the substrate 110, the light emitting element 120, the first wall structure 130, the first top conductive pattern 140, the planarization protecting layer 160, the pixel defining layer 170 and the light transmitting region conductive layer 180; the related descriptions are reiterated herein. Additionally, the barrier multi-layer structure 350 in the embodiment includes a first barrier layer 352 and a second barrier layer 354, which is different from the design of the embodiment in FIG. 2 which uses three barrier layers.

The first barrier layer 352 and the second barrier layer 354 may be formed of different materials. In some embodiments, the first barrier layer 352 may be a polymer material such as polyacrylate or other polymer material. The first barrier layer 352 may be formed in the light emitting region 112 surrounded by the first wall structure 130 via coating or dispensing. Moreover, the thickness of the material of the first barrier layer 352 is smaller than the height of the first wall structure 130, and therefore the first barrier layer 352 may be restricted to the light emitting region 112 surrounded by the first wall structure 130. The second barrier layer 354 may be formed of the coating-type barrier material. The coating-type barrier material is, for example, a gel-state or liquid-state material containing silicon, nitrogen and oxygen. A method for manufacturing the second barrier layer 354 includes forming the coating-type barrier material in the light emitting region 112 surrounded by the first wall structure 130 via coating or dispensing so the coating-type barrier material is accumulated on the first barrier layer 352. Thereafter, the coating-type barrier material is dried and cured to form the second barrier layer 354 in the light emitting region 112. The first barrier layer 352 and the second barrier layer 354 are formed in the light emitting region 112; the overlapping portion where the first barrier layer 352 overlaps the second barrier layer 354 is also located in the light emitting region 112 surrounded by the first wall structure 130. In this manner, the transparent display device 300 in the light transmitting region 114 can have good visible light-transmitting property in the absence of the first barrier layer 252 and the second barrier layer 254, and have good moisture and/or oxygen resistance property in the light emitting region 112. Additionally, the second electrode 128 of the embodiment can be spaced apart from the first top conductive pattern 140 via the first wall structure 130 and covered by the first barrier layer 252 and the second barrier layer 254, the second electrode 128 can be protected from the effect caused by the moisture and/or oxygen entered from the lateral side and thus has better reliability.

Figure 6:
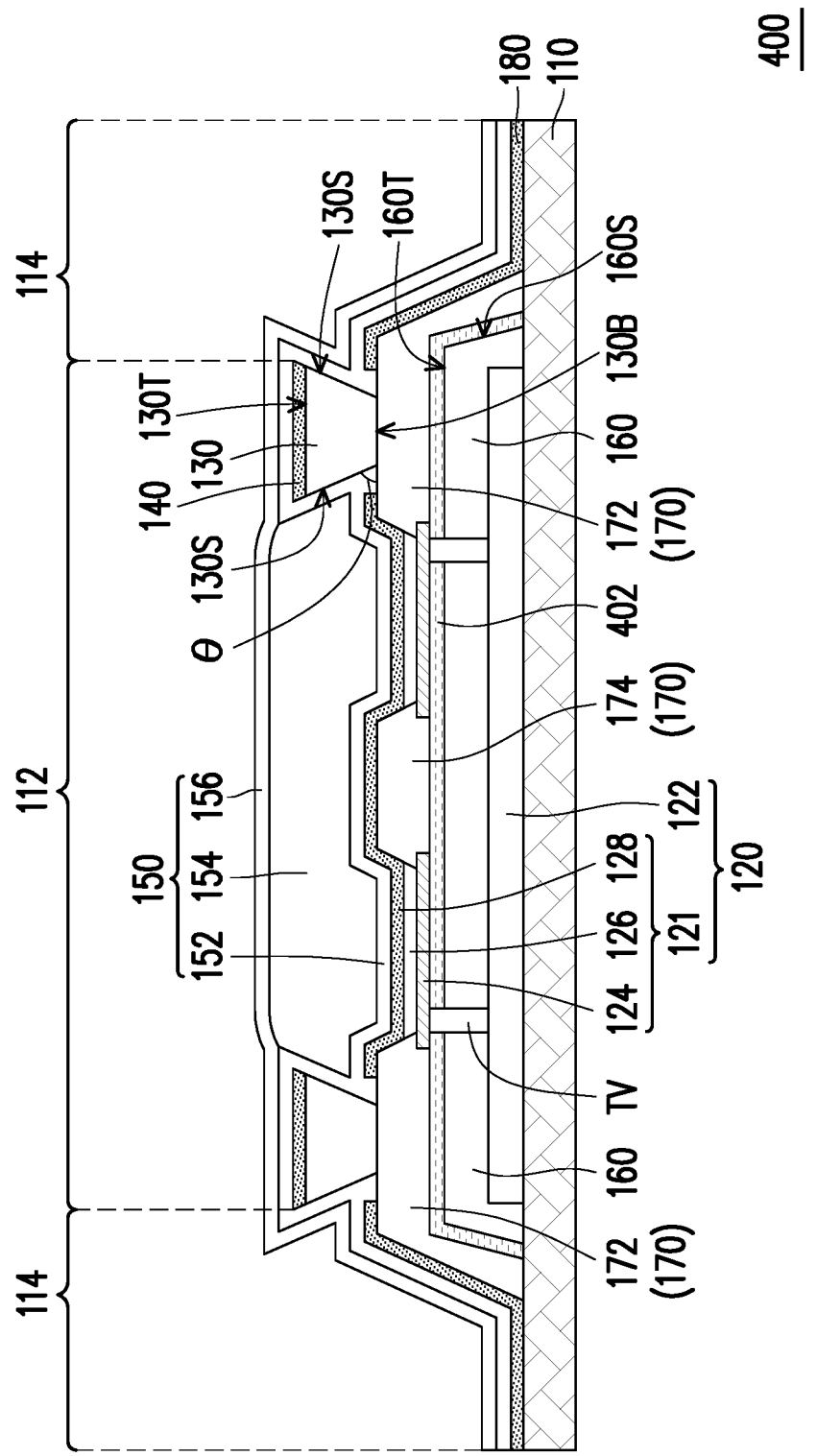
FIG. 6 is a cross-sectional view of a transparent display device according to yet another embodiment of the disclosure.

FIG. 6 is a cross-sectional view of a transparent display device according to yet another embodiment of the disclosure. Referring to FIG. 6, a transparent display device 400 is substantially similar to the transparent display device 100 in FIG. 2; thus, the same or similar reference numerals in the two embodiments represent the same or similar elements. The transparent display device 400 not only includes a substrate 110, a light emitting element 120, a first wall structure 130, a first top conductive pattern 140, a barrier multi-layer structure 150, a planarization protecting layer 160, a pixel defining layer 170 and a light transmitting region conductive layer 180 but also includes an inorganic protecting layer 402. Here, the previous embodiment may serve as reference to facilitate understanding of the configuration, structure and material of the substrate 110, the light emitting element 120, the first wall structure 130, the first top conductive pattern 140, the barrier multi-layer structure 150, the planarization protecting layer 160, the pixel defining layer 170 and the light transmitting region conductive layer 180, and the barrier multi-layer structure 150 may be replaced by the above-mentioned barrier multi-layer structure 250 or the barrier multi-layer structure 350; the related descriptions of the elements are not reiterated herein.

The transparent display device 400 of the embodiment further includes an inorganic protecting layer 402. The inorganic protecting layer 402 covers the planarization protecting layer 160 and located between an outer periphery portion 172 of the pixel defining layer 170 and the planarization protecting layer 160. The material of the inorganic protecting layer 402 may include silicon oxide, silicon nitride, silicon oxynitride and so on. The inorganic protecting layer 402 not only covers the upper surface of the planarization protecting layer 160 but also covers a side surface of the planarization protecting layer 160. In the embodiment, the outer periphery portion 172 of the pixel defining layer 170, the planarization protecting layer 160 and the inorganic protecting layer 402 may be extended to the surface of the substrate 110, so that the inorganic protecting layer 402 covers the planarization protecting layer 160 on the lateral direction of the driving circuit complex layer 122, and the outer periphery portion 172 of the pixel defining layer 170 covers a sidewall of the inorganic protecting layer 402. In addition, the conductive via TV not only penetrates through the planarization protecting layer 160, but also penetrates through the inorganic protecting layer 402 in the embodiment so that the driving circuit complex layer 122 and the organic light emitting structure 121 are electrically connected.

Figure 7:
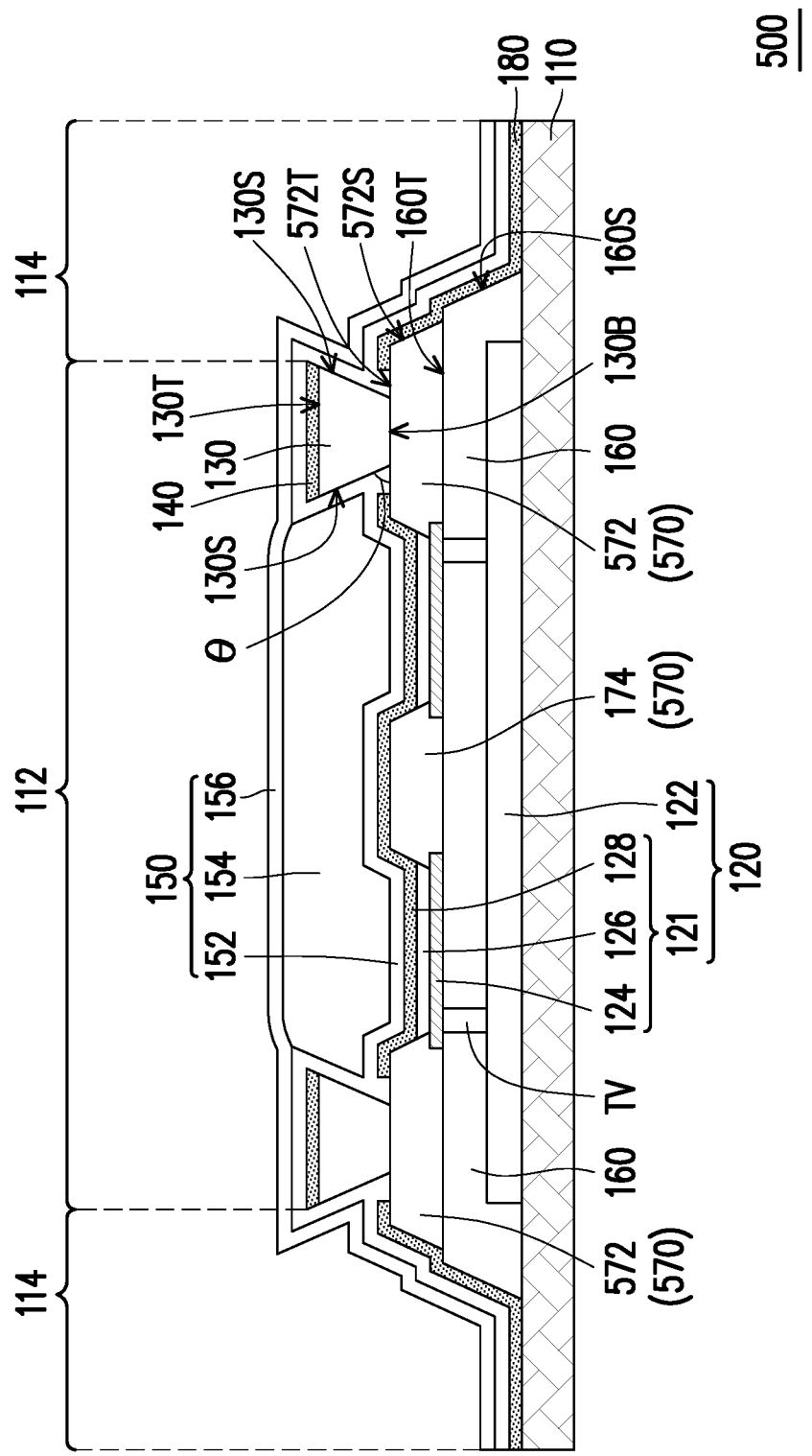
FIG. 7 is a cross-sectional view of a transparent display device according to yet another embodiment of the disclosure.

FIG. 7 is a cross-sectional view of a transparent display device according to yet another embodiment of the disclosure. Referring to FIG. 7, a transparent display device 500 is substantially similar to the transparent display device 100 in FIG. 2; thus, the same or similar reference numerals in the two embodiments represent the same or similar elements. The transparent display device 500 includes a substrate 110, a light emitting element 120, a first wall structure 130, a first top conductive pattern 140, a barrier multi-layer structure 150, a planarization protecting layer 160, a pixel defining layer 570 and a light transmitting region conductive layer 180. Here, the previous embodiment may serve as reference to facilitate understanding of the configuration, structure and material of the substrate 110, the light emitting element 120, the first wall structure 130, the first top conductive pattern 140, the barrier multi-layer structure 150, the planarization protecting layer 160 and the light transmitting region conductive layer 180. Additionally, the barrier multi-layer structure 150 may be replaced by the above-mentioned barrier multi-layer structure 250 or the barrier multi-layer structure 350; thus, the related descriptions of the elements are not reiterated herein.

In the embodiment, the pixel defining layer 570 includes an outer periphery portion 572 and a separating portion 174, wherein the outer periphery portion 572 is substantially distributed along the boundary between the light emitting region 112 and the light transmitting region 114, and the separating portion 174 is located in the light emitting region 112 to separate the plurality of organic light emitting structures 121 in the light emitting element 120. The separating portion 174 of the pixel defining layer 171 described in the previous embodiment may serve as reference to facilitate understanding of the structure and configuration of the separating portion 174 of the pixel defining layer 570. However, in the embodiment, the outer periphery portion 572 of the pixel defining layer 570 may be completely disposed on the upper surface 160T of the planarization protecting layer 160, and a sidewall 160S of the planarization protecting layer 160 is not covered by the pixel defining layer 570. In addition, the outer periphery portion 572 of the pixel defining layer 570 and the planarization protecting layer 160 construct a step-like structure, and the light transmitting region conductive layer 180 may continuously cover an upper surface 572T of the outer periphery portion 572 of the pixel defining layer 570, a sidewall 572S of the outer periphery portion 572 of the pixel defining layer 570, the upper surface 160T of the planarization protecting layer 160 and the sidewall 160S of the planarization protecting layer 160 and further extend in a direction away from the light emitting region 112. In some embodiments, the inorganic protecting layer 402 in FIG. 6 may be applied to the transparent display device 500 and cover the upper surface 160T of the planarization protecting layer 160 as well as the sidewall 160S of the planarization protecting layer 160. At this time, the light transmitting region conductive layer 180 may cover the inorganic protecting layer 402 without being in contact with the planarization protecting layer 160.

Figure 8:
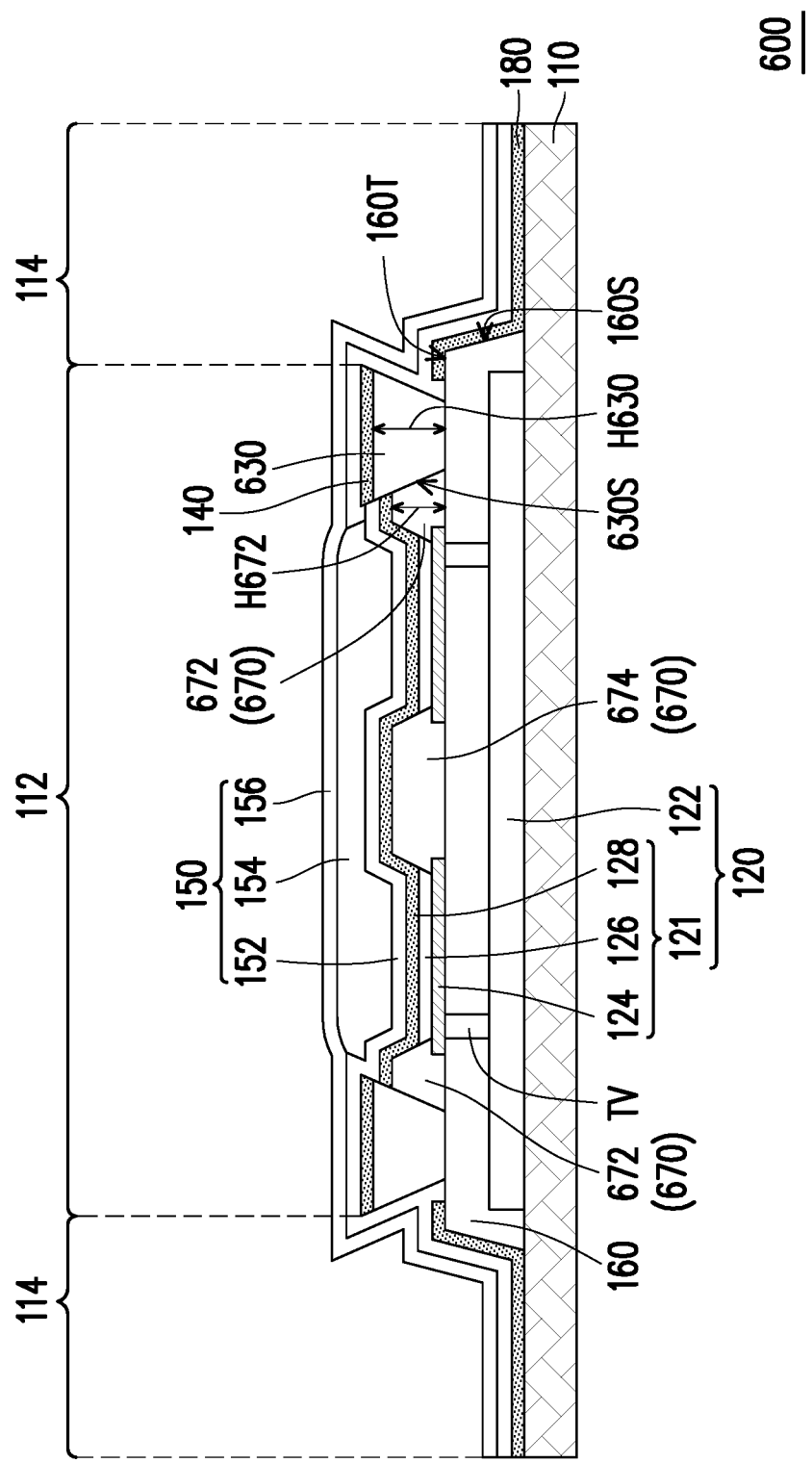
FIG. 8 is a cross-sectional view of a transparent display device according to still another embodiment of the disclosure.

FIG. 8 is a cross-sectional view of a transparent display device according to still another embodiment of the disclosure. Referring to FIG. 8, a transparent display device 600 is substantially similar to the transparent display device 100 in FIG. 2; thus, the same or similar reference numerals in the two embodiments represent the same or similar elements. The transparent display device 600 includes a substrate 110, a light emitting element 120, a first wall structure 630, a first top conductive pattern 140, a barrier multi-layer structure 150, a planarization protecting layer 160, a pixel defining layer 670 and a light transmitting region conductive layer 180. Here, the previous embodiment may serve as reference to facilitate understanding of the configuration, structure and material of the substrate 110, the light emitting element 120, the first top conductive pattern 140, the barrier multi-layer structure 150, the planarization protecting layer 160, and the light transmitting region conductive layer 180. Additionally, the barrier multi-layer structure 250 may be replaced by the above-mentioned barrier multi-layer structure 250 or the barrier multi-layer structure 350; thus, the related descriptions of the elements are not reiterated herein.

In the embodiment, the pixel defining layer 670 includes an outer periphery portion 672 and a separating portion 674, wherein the outer periphery portion 672 is substantially distributed extensively along the boundary between the light emitting region 112 and the light transmitting region 114, and the separating portion 674 is located in the light emitting region 112 to separate the plurality of organic light emitting structures 121 in the light emitting element 120. Additionally, the first wall structure 630 and the outer periphery portion 672 of the pixel defining layer 670 are disposed on the upper surface 160T of the planarization protecting layer 160. The first wall structure 630 and the outer periphery portion 672 of the pixel defining layer 670 are not stacked on each other but arranged in parallel. The outer periphery portion 672 of the pixel defining layer 670 is located between the first wall structure 630 and the light emitting element 120; that is, the outer periphery portion 672 of the pixel defining layer 670 is disposed on a side of the first wall structure 630 adjacent to the light emitting region 112.

In the embodiment, the first wall structure 630 has an undercut sidewall 630S, and a height H630 of the first wall structure 630 is greater than a height H672 of the outer periphery portion 672 of the pixel defining layer 670. On a side of the first wall structure 630 near the light emitting region 112, a portion of the undercut sidewall 630S is protruded from a plane of the top of the outer periphery portion 672. The second electrode 128 of the light emitting element 120 and the first top conductive pattern 140 are separated from each other via the undercut sidewall 630S of the first wall structure 630. In some embodiments, a difference between the height H630 of the first wall structure 630 and the height H672 of the outer periphery portion 672 of the pixel defining layer 670 may be larger than a thickness of the second electrode 128 of the light emitting element 120 to ensure that the second electrode 128 is separated from the first top conductive pattern 140 at the undercut sidewall 630S.

Figure 9:
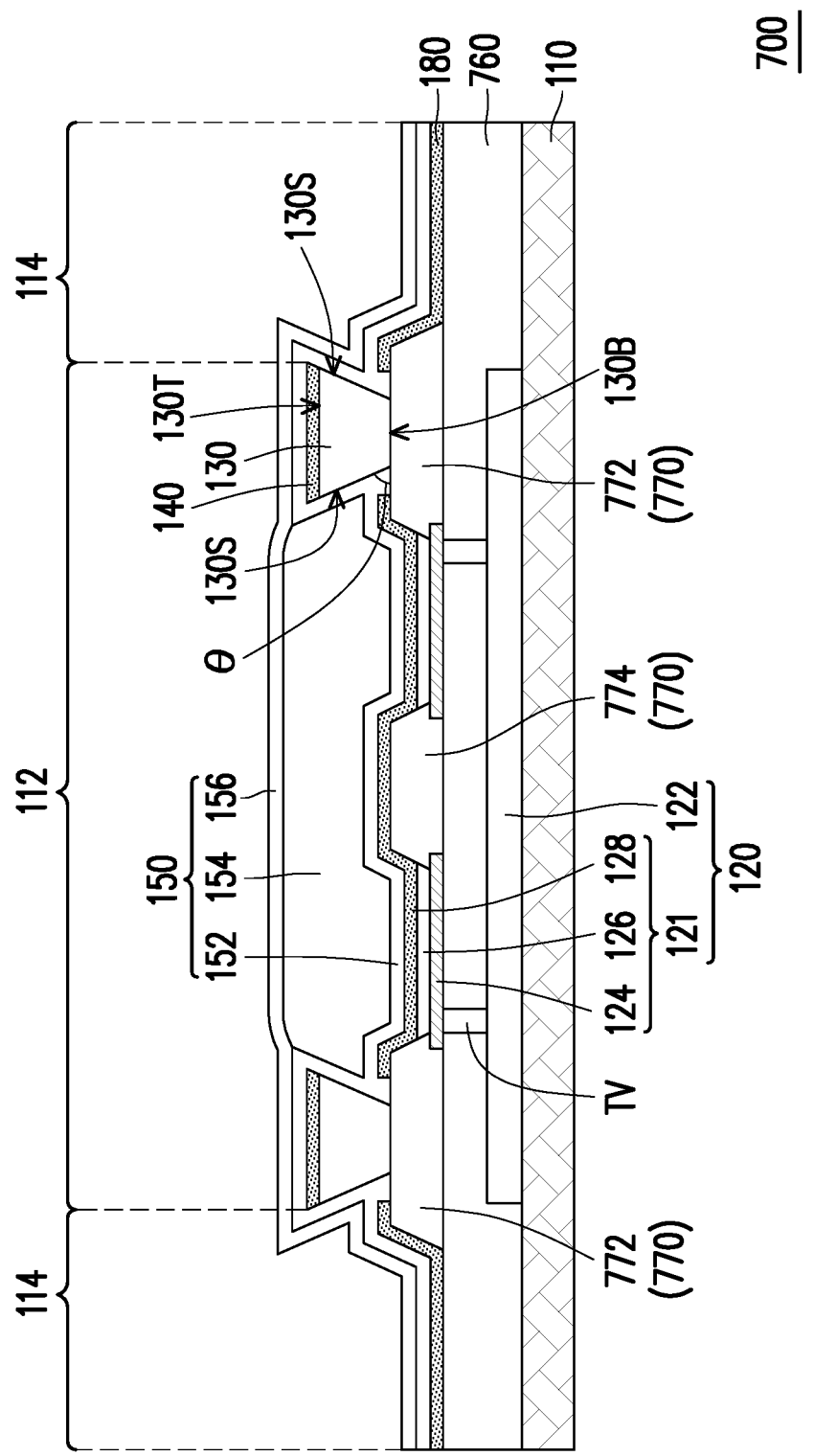
FIG. 9 is a cross-sectional view of a transparent display device according to yet another embodiment of the disclosure.

FIG. 9 is a cross-sectional view of a transparent display device according to yet another embodiment of the disclosure. Referring to FIG. 9, a transparent display device 700 is substantially similar to the transparent display device 100 in FIG. 2; thus, the same or similar reference numerals in the two embodiments represent the same or similar elements. The transparent display device 700 includes a substrate 110, a light emitting element 120, a first wall structure 130, a first top conductive pattern 140, a barrier multi-layer structure 150, a planarization protecting layer 760, a pixel defining layer 770 and a light transmitting region conductive layer 180. Here, the previous embodiment may serve as reference to facilitate understanding of the configuration, structure and material of the substrate 110, the light emitting element 120, the first wall structure 130, the first top conductive pattern 140, the barrier multi-layer structure 150 and the light transmitting region conductive layer 180. Additionally, the barrier multi-layer structure 150 may be replaced by the above-mentioned barrier multi-layer structure 250 or the barrier multi-layer structure 350; thus, the related descriptions of the elements are not reiterated herein.

In the embodiment, the planarization protecting layer 760 may continuously cover the area of the light emitting region 112 and the light transmitting region 114. In other words, the planarization protecting layer 760 covers most of the area of the substrate 110. The light transmitting region conductive layer 180 in the light transmitting region 114 covers the planarization protecting layer 760. The pixel defining layer 770 includes an outer periphery portion 772 and a separating portion 174, wherein the outer periphery portion 772 is substantially distributed extensively along the boundary between the light emitting region 112 and the light transmitting region 114, and the separating portion 174 is located in the light emitting region 112 to separate the plurality of organic light emitting structures 121 in the light emitting element 120. Meanwhile, the entire outer periphery portion 772 of the pixel defining layer 770 is disposed on the planarization protecting layer 760.

Figure 10:
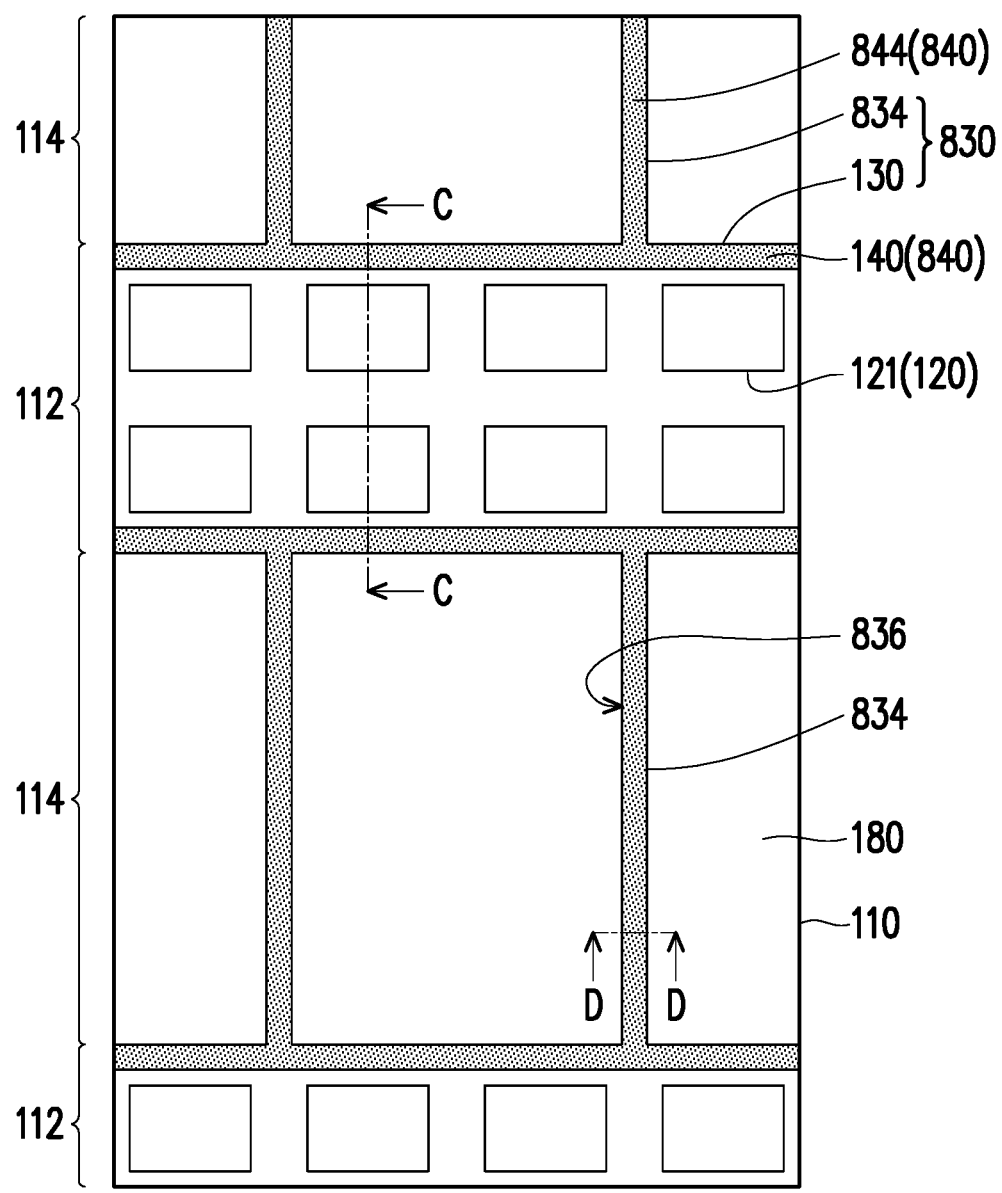
FIG. 10 is a top view of a portion of a transparent display device according to still another embodiment of the disclosure.

FIG. 10 is a top view of a portion of a transparent display device according to still another embodiment of the disclosure. FIG. 10 shows that a transparent display device 800 includes a substrate 110, a light emitting element 120, a wall structure 830, a patterned top conductive layer 840 and a light transmitting region conductive layer 180. The light emitting element 120 and the wall structure 830 are disposed on the substrate 110. The patterned top conductive layer 840 is disposed on the top surface of the wall structure 830. The patterned top conductive layer 840 in FIG. 10 overlaps the wall structure 830, and FIG. 10 is illustrated with fine dot pattern to represent the area of the patterned top conductive layer 840. The light emitting element 120 is located in the light emitting region 112 and located in the light emitting region 112 surrounded by the wall structure 830. The light transmitting region conductive layer 180 is disposed in the light transmitting region 114. Additionally, FIG. 10 exemplifies that the light emitting element 120 may include a plurality of organic light emitting structures 121; however, in other embodiments, the light emitting element 120 may be a single organic light emitting structure 121.

In the embodiment, the wall structure 830 includes the first wall structure 130 and a second wall structure 834. The first wall structure 130 may surround the light emitting element 120 and separate the substrate 110 into a light emitting region 112 and a light transmitting region 114 as the boundary between the light transmitting region 114 and the light emitting region 112. In other words, the layout of the first wall structure 130 in the top view may be substantially the same as the first wall structure 130 described in the previous embodiments. The second wall structure 834 is located in the light transmitting region 114 and connected with the first wall structure 130 to form a plurality of openings 836 in the light transmitting region 114. The light transmitting region conductive layer 180 is disposed in the opening 836. Additionally, the patterned top conductive layer 840 in the embodiment is not only distributed along the top surface of the first wall structure 130 to construct the first top conductive pattern 140, but also distributed along the top surface of the second wall structure 834 to construct the second top conductive pattern 844. The second wall structure 834 also has an undercut sidewall. The patterned top conductive layer 840 is in conformity with the top surface of the wall structure 830 to construct a grid conductive pattern, and the patterned top conductive layer 840 forms an independent conductive pattern via the undercut sidewall of the wall structure 830 without being connected with the conductive layer in other regions. Furthermore, the design of cross-sectional structure of the transparent display device 800 taken along the line C-C may be the same as any one of FIG. 2 and FIG. 4 to FIG. 9.

In the example that the design of the cross-sectional structure of the transparent display device 800 taken along line C-C is similar to or substantially the same as the structure shown in FIG. 2, it can be understood that, in the embodiment, the transparent display device 800 further includes a barrier multi-layer structure 150, a planarization protecting layer 160 and a pixel defining layer 170. In the embodiment, the barrier multi-layer structure 150, the planarization protecting layer 160 and the pixel defining layer 170 are substantially the same as the barrier multi-layer structure 150, the planarization protecting layer 160 and the pixel defining layer 170 as shown in FIG. 2. The previous embodiment may serve as reference to facilitate understanding of the structural design and configuration of the elements. Moreover, FIG. 2 shows that the light emitting element 120 includes a driving circuit complex layer 122, a first electrode 124, a light emitting layer 126 and a second electrode 128, wherein the stacked structure of the first electrode 124, the light emitting layer 126 and the second electrode 128 may construct an organic light emitting structure 121.

Figure 11:
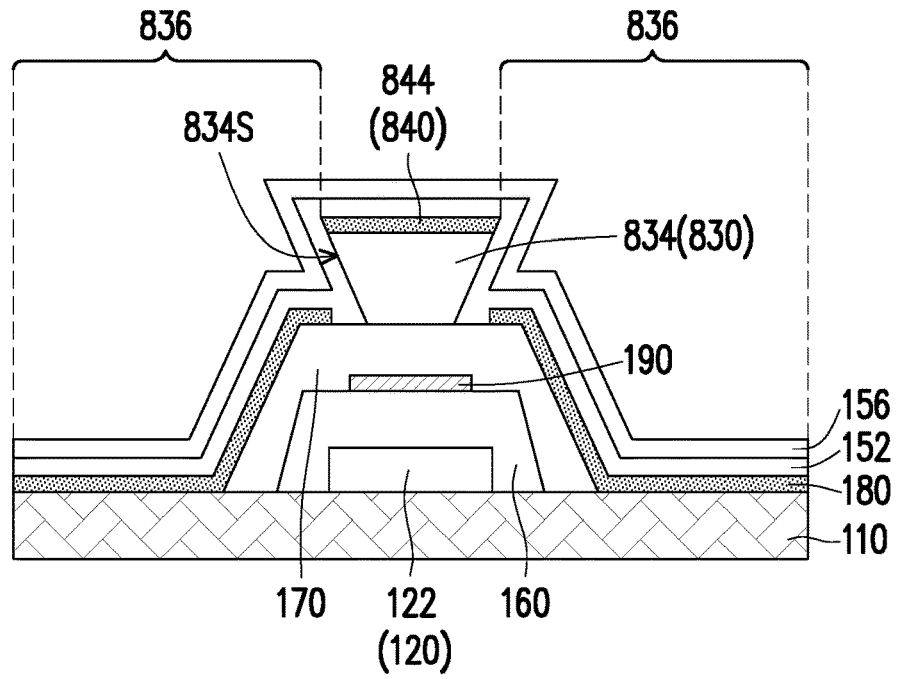
FIG. 11 is a schematic view of an embodiment of a cross-section of a transparent display device 800 taken along line D-D.

In the circumstance that the design of the cross-sectional structure of the transparent display device 800 taken along line C-C is similar to the design shown in FIG. 2, a schematic view of an embodiment of the cross-section of the transparent display device 800 taken along line D-D is as shown in FIG. 11. Referring to FIG. 11 and FIG. 2, the driving circuit complex layer 122 of the light emitting element 120, the planarization protecting layer 160 covering the driving circuit complex layer 122 and the pixel defining layer 170 may be distributed along the second wall structure 834. In the cross-section shown in FIG. 11, a structure is constructed in the manner that the driving circuit complex layer 122, the planarization protecting layer 160, the pixel defining layer 170 and the second wall structure 834 are stacked on the substrate 110 in sequence. According to the description provided in the previous embodiments, the second electrode 128 of the light emitting element 120 uses the second electrode transmission line 190 to be connected to the circuit element outside of the light emitting region 112, and the second electrode transmission line 190 may be arranged along the second wall structure 834. Therefore, FIG. 11 shows that the second electrode transmission line 190 is disposed between the pixel defining layer 170 and the planarization protecting layer 160. In addition, the patterned top conductive layer 840 is manufactured via the manufacturing method for the first top conductive pattern 140 described in the previous embodiment. Therefore, the first top conductive pattern 140, the second top conductive pattern 844 and the second electrode 128 of the light emitting element 120 are made of the same layer. The second wall structure 834 has the undercut sidewall; thus the second top conductive pattern 844 and the light transmitting region conductive layer 180 in the opening 836 can be separated from each other via an undercut sidewall 834S of the second wall structure 834. In this manner, the first top conductive pattern 140 located on the first wall structure 130 and the second top conductive pattern 844 located on the second wall structure 834 construct a grid pattern without being electrically connected with the light transmitting region conductive layer 180 to serve as a touch sensing electrode. In other words, the transparent display device 800 can realize touch sensing function by existing patterned top conductive layer 840 without the configuration of an additional conductive element used for touch sensing.

Furthermore, according to the descriptions provided in the previous embodiments, in the circumstance where the design of the cross-sectional structure of the transparent display device 800 taken along line C-C is similar to the design shown in FIG. 2, the light transmitting region conductive layer 180 and the second top conductive pattern 844 are covered by the first barrier layer 152 of the barrier multi-layer structure 150 and the third barrier layer 156.

Figure 12:
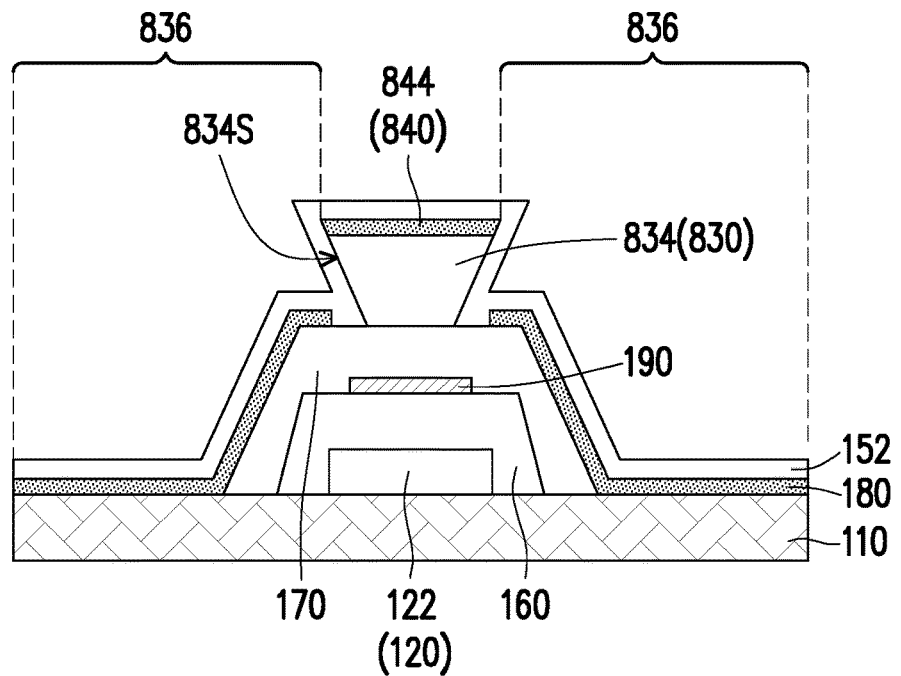
FIG. 12 is a schematic view of an embodiment of a cross-section of a transparent display device 800 taken along line D-D.

In the circumstance that the design of the cross-sectional structure of the transparent display device 800 taken along line C-C is similar to the design shown in FIG. 4, the transparent display device 800 further includes the barrier multi-layer structure 250, the planarization protecting layer 160 and the pixel defining layer 170. In the embodiment, the barrier multi-layer structure 250, the planarization protecting layer 160 and the pixel defining layer 170 are substantially the same as the barrier multi-layer structure 250, the planarization protecting layer 160 and the pixel defining layer 170 shown in FIG. 4. Therefore, the previous embodiments may serve as reference to facilitate understanding of the structural design and the configuration relationship of the elements. Additionally, the cross-section of the transparent display device 800 taken along line D-D may be as shown in FIG. 12. In the embodiment shown in FIG. 12, the light transmitting region conductive layer 180 and the second top conductive pattern 844 are covered by the first barrier layer 152 of the barrier multi-layer structure 250.

Figure 13:
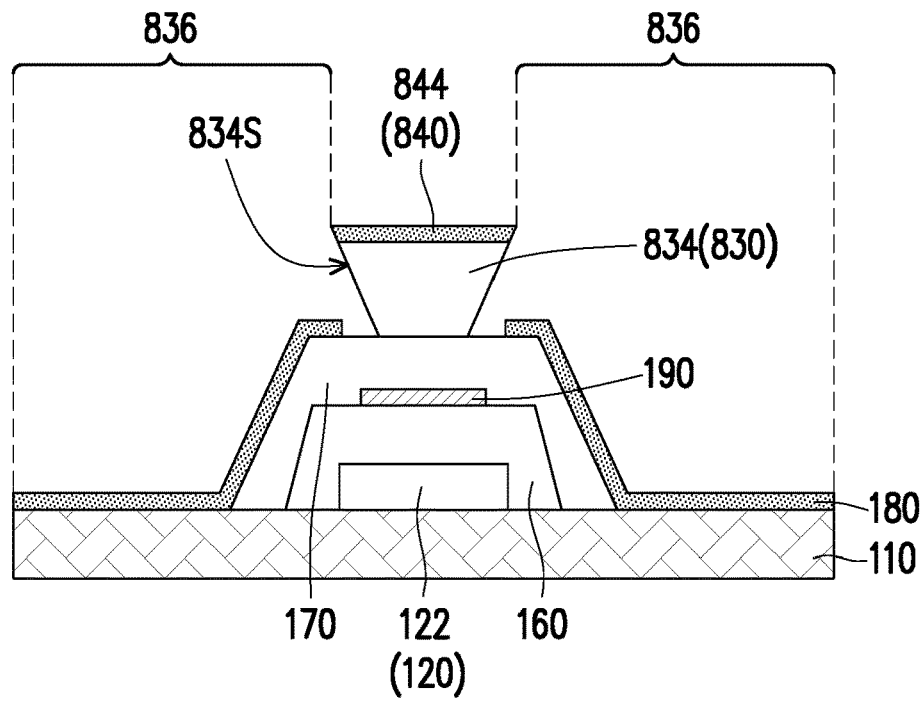
FIG. 13 is a schematic view of an embodiment of a cross-section of a transparent display device 800 taken along line D-D.

In the circumstance that the design of cross-sectional structure of the transparent display device 800 taken along line C-C is similar to the design in FIG. 5, the transparent display device 800 further includes the barrier multi-layer structure 150, the planarization protecting layer 160 and the pixel defining layer 170. In the embodiment, the barrier multi-layer structure 150, the planarization protecting layer 160 and the pixel defining layer 170 are substantially the same as the barrier multi-layer structure 150, the planarization protecting layer 160 and the pixel defining layer 170 shown in FIG. 2. Therefore, the previous embodiment may serve as reference to facilitate understanding of the structural design and configuration relationship of the elements. Moreover, the cross-section of the transparent display device 800 taken along line D-D may be substantially as shown in FIG. 13, which is similar to the design in FIG. 11. In the embodiment of FIG. 13, since the barrier multi-layer structure may be, for example, the barrier multi-layer structure 350 in FIG. 5; the light transmitting region conductive layer 180 and the second top conductive pattern 844 are not covered by any barrier layer of the barrier multi-layer structure 350.

Figure 14:
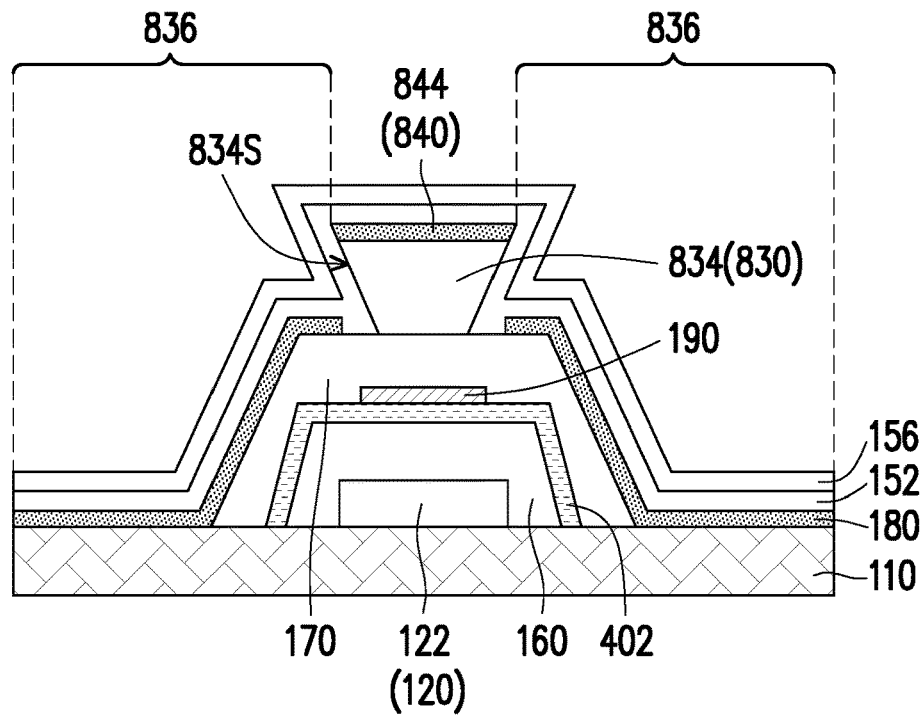
FIG. 14 is a schematic view of an embodiment of a cross-section of a transparent display device 800 taken along line D-D.

In the circumstance that the design of the cross-sectional structure of the transparent display device 800 taken along line C-C is similar to the structure of FIG. 6, the transparent display device 800 further includes the barrier multi-layer structure 350, the planarization protecting layer 160 and the pixel defining layer 170. In the embodiment, the barrier multi-layer structure 350, the planarization protecting layer 160 and the pixel defining layer 170 are substantially the same as the barrier multi-layer structure 350, the planarization protecting layer 160 and the pixel defining layer 170 shown in FIG. 6. Therefore, the previous embodiments may serve as reference to facilitate understanding of the structural design and configuration relationship of the elements. Additionally, a schematic view of an embodiment of the cross-section of the transparent display device 800 taken along line D-D may be as shown in FIG. 14. As shown in FIG. 14, an inorganic protecting layer 402 is further disposed between the planarization protecting layer 160 and the pixel defining layer 170, wherein the inorganic protecting layer 402 covers the sidewall and upper surface of the planarization protecting layer 160, and disposed between the pixel defining layer 170 and the planarization protecting layer 160. The reference numerals used for some elements in FIG. 14 are the same as those used in FIG. 11. Descriptions about FIG. 11 may serve as reference to facilitate understanding of the configuration and design of the elements; thus, the related descriptions are not reiterated herein.

Figure 15:
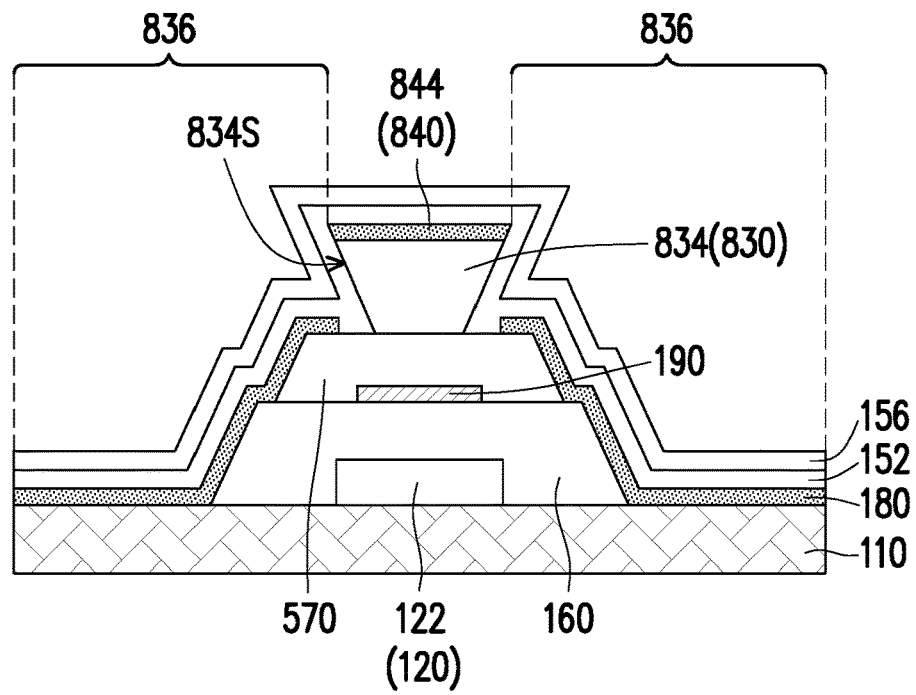
FIG. 15 is a schematic view of an embodiment of a cross-section of a transparent display device 800 taken along line D-D.

In the circumstance that the design of the cross-sectional structure of the transparent display device 800 taken along line C-C is similar to the design shown in FIG. 7, the transparent display device 800 further includes the barrier multi-layer structure 150, the planarization protecting layer 160 and the pixel defining layer 570. In the embodiment, the barrier multi-layer structure 150, the planarization protecting layer 160 and the pixel defining layer 570 are substantially the same as the barrier multi-layer structure 150, the planarization protecting layer 160 and the pixel defining layer 570 as shown in FIG. 7. Therefore, the previous embodiments may serve as reference to facilitate understanding of the structural design and configuration relationship of the elements. Additionally, a schematic view of an embodiment of the cross-section of the transparent display device 800 taken along line D-D is as shown in FIG. 15. FIG. 15 is similar to FIG. 11; the reference numerals used for some elements in FIG. 15 are the same as those used in FIG. 11. Descriptions about FIG. 11 may serve as reference to facilitate understanding of the configuration and design of the elements; thus, the related descriptions are not reiterated herein. In FIG. 15, the pixel defining layer 570 is completely disposed on the upper surface of the planarization protecting layer 160 without covering the sidewall of the planarization protecting layer 160. In FIG. 15, the light transmitting region conductive layer 180 covers and is in contact with the sidewall of the planarization protecting layer 160.

Figure 16:
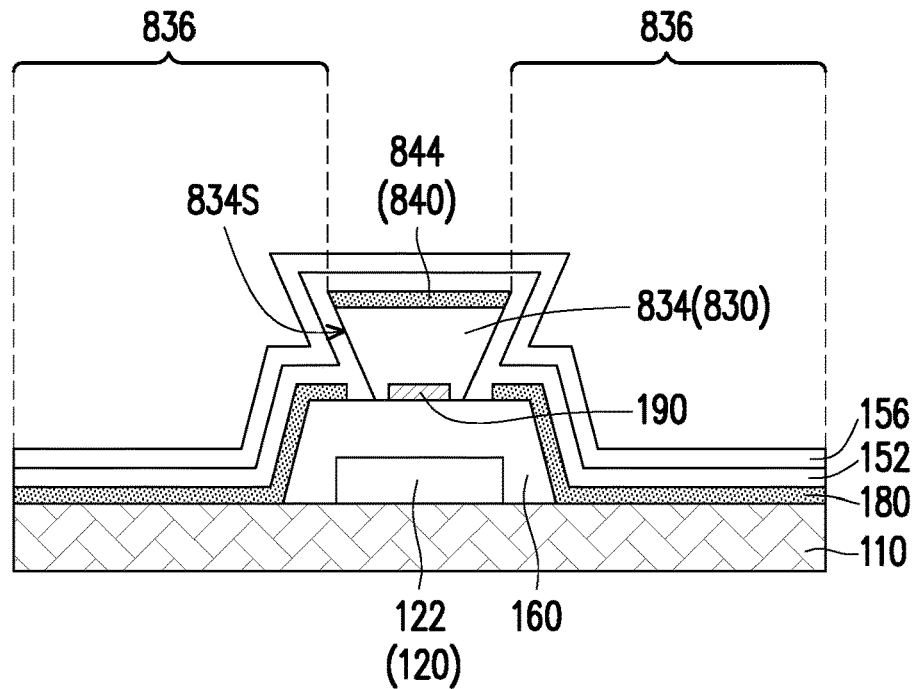
FIG. 16 is a schematic view of an embodiment of a cross-section of a transparent display device 800 taken along line D-D.

In the circumstance that the design of the cross-sectional structure of the transparent display device 800 taken along line C-C is similar to the design shown in FIG. 8, the transparent display device 800 further includes the barrier multi-layer structure 150, the planarization protecting layer 160 and the pixel defining layer 670, and the cross-sectional structure of the first wall structure 130 is similar to the first wall structure 630 in FIG. 8. In the embodiment, the barrier multi-layer structure 150, the planarization protecting layer 160 and the pixel defining layer 170 are substantially the same as the barrier multi-layer structure 150, the planarization protecting layer 160 and the pixel defining layer 670 shown in FIG. 8. Therefore, the previous embodiment may serve as reference to facilitate understanding of the structural design and configuration relationship of the elements. Additionally, a schematic view of an embodiment of the cross-section of the transparent display device 800 taken along line D-D is as shown in FIG. 16. FIG. 16 is similar to FIG. 11, the reference numerals of some elements in FIG. 16 are the same as those used in FIG. 11. Descriptions about FIG. 11 may serve as reference to facilitate understanding of the configuration and design of the elements; thus, the related descriptions are not reiterated herein. In FIG. 16, the second wall structure 834 is disposed on the upper surface of the planarization protecting layer 160 and the second electrode transmission line 190 is sandwiched between the second wall structure 834 and the planarization protecting layer 160. In other words, there may be no pixel defining layer 670 provided between the second wall structure 834 and the planarization protecting layer 160.

Figure 17:
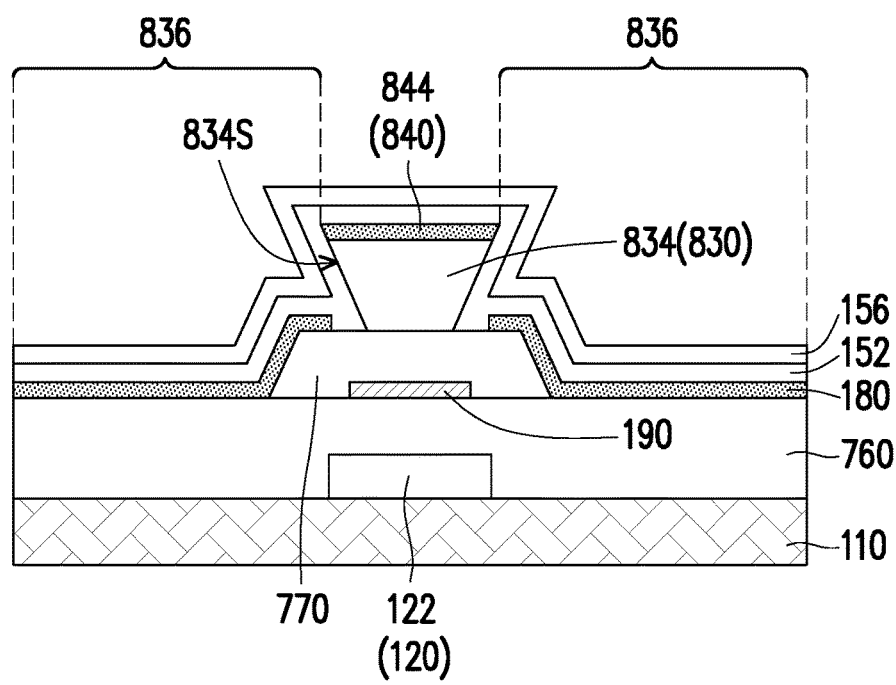
FIG. 17 is a schematic view of an embodiment of a cross-section of a transparent display device 800 taken along line D-D.

In the circumstance that the design of the cross-sectional structure of the transparent display device 800 taken along line C-C is similar to the design shown in FIG. 9, the transparent display device 800 further includes the barrier multi-layer structure 150, the planarization protecting layer 760 and the pixel defining layer 770. In the embodiment, the barrier multi-layer structure 150, the planarization protecting layer 760 and the pixel defining layer 770 are substantially the same as the barrier multi-layer structure 150, the planarization protecting layer 760 and the pixel defining layer 770 shown in FIG. 9. Therefore, the previous embodiments may serve as reference to facilitate understanding of the structural design and configuration relationship of the elements. Additionally, a schematic view of an embodiment of the cross-section of the transparent display device 800 taken along line D-D is as shown in FIG. 17. FIG. 17 is similar to FIG. 11. The reference numerals of some elements shown in FIG. 17 are the same as those used in FIG. 11. Descriptions about FIG. 11 may serve as reference to facilitate understanding of the configuration and design of the elements; thus, the related descriptions are not reiterated herein. In FIG. 17, the planarization protecting layer 760 completely covers the substrate 110, and the entire pixel defining layer 770 is disposed on the planarization protecting layer 760, and the light transmitting region conductive layer 180 covers the planarization protecting layer 760.

Figure 18:
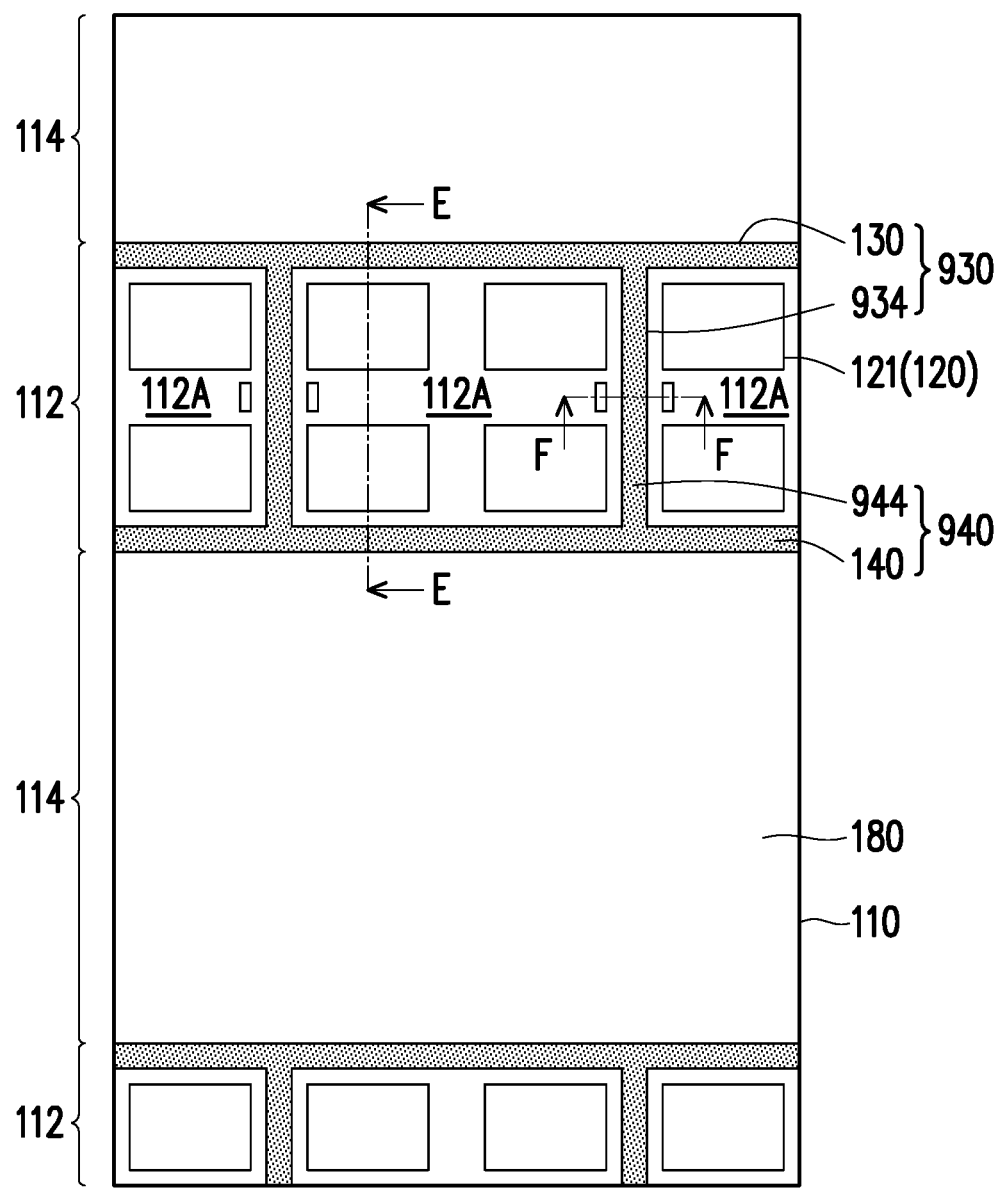
FIG. 18 is a top view of a portion of a transparent display device according to an embodiment of the disclosure.

FIG. 18 is a top view of a portion of a transparent display device according to an embodiment of the disclosure. Referring to FIG. 18, a transparent display device 900 includes a substrate 110, a light emitting element 120, a wall structure 930, a patterned top conductive layer 940 and a light transmitting region conductive layer 180. The light emitting element 120 and the wall structure 930 are disposed on the substrate 110. The patterned top conductive layer 940 is disposed on the top surface of the wall structure 930. In FIG. 18, the patterned top conductive layer 940 and the wall structure 930 are overlapped, and FIG. 18 is illustrated with fine dot pattern to represent the area of the patterned top conductive layer 940. The light emitting element 120 is disposed in the light emitting region 112 and located in the light emitting region 112 surrounded by the wall structure 930. The light transmitting region conductive layer 180 is disposed in the light transmitting region 114. Additionally, FIG. 18 exemplifies that the light emitting element 120 includes a plurality of organic light emitting structures 121. However, in other embodiments, the light emitting element 120 may be a single organic light emitting structure 121. In the embodiment, the light transmitting region 114 may be provided without the barrier multi-layer structure 150, which facilitates to improve visible light transmittance of the transparent display device 900 in the light transmitting region 114 such that the transparency of the transparent display device 900 is enhanced.

In the embodiment, the wall structure 930 includes a first wall structure 130 and a second wall structure 934. The first wall structure 130 may surround the light emitting element 120, separate the substrate 110 into the light emitting region 112 and the light transmitting region 114 and define the boundary between the light transmitting region 114 and the light emitting region 112. In other words, the layout of the first wall structure 130 in the top view may be substantially the same as the first wall structure 130 described in the previous embodiments. The second wall structure 934 is located in the light emitting region 112 and connected with the first wall structure 130 to construct a grid in the light emitting region 112. Additionally, the patterned top conductive layer 940 in the embodiment is not only distributed along the top surface of the first wall structure 130 to construct the first top conductive pattern 140, but also distributed along the top surface of the second wall structure 934 to construct the second top conductive pattern 944. The patterned top conductive layer 940 is in conformity with the top surface of the wall structure 930 to construct a grid conductive pattern. The design of the cross-sectional structure of the transparent display device 900 taken along line E-E may be the same as any one of FIG. 2 and FIGS. 4-9.

In the example that design of the cross-sectional structure of the transparent display device 900 taken along line E-E is similar to the design of FIG. 2, it can be understood that the transparent display device 900 in the embodiment further includes the barrier multi-layer structure 150, the planarization protecting layer 160 and the pixel defining layer 170; the previous embodiment may serve as reference to facilitate understanding the structural design and configuration of the elements. FIG. 2 also shows that the light emitting element 120 includes the driving circuit complex layer 122, the first electrode 124, the light emitting layer 126 and the second electrode 128, wherein the stacked structure of the first electrode 124, the light emitting layer 126 and the second electrode 128 may construct the organic light emitting structure 121.

Figure 19:
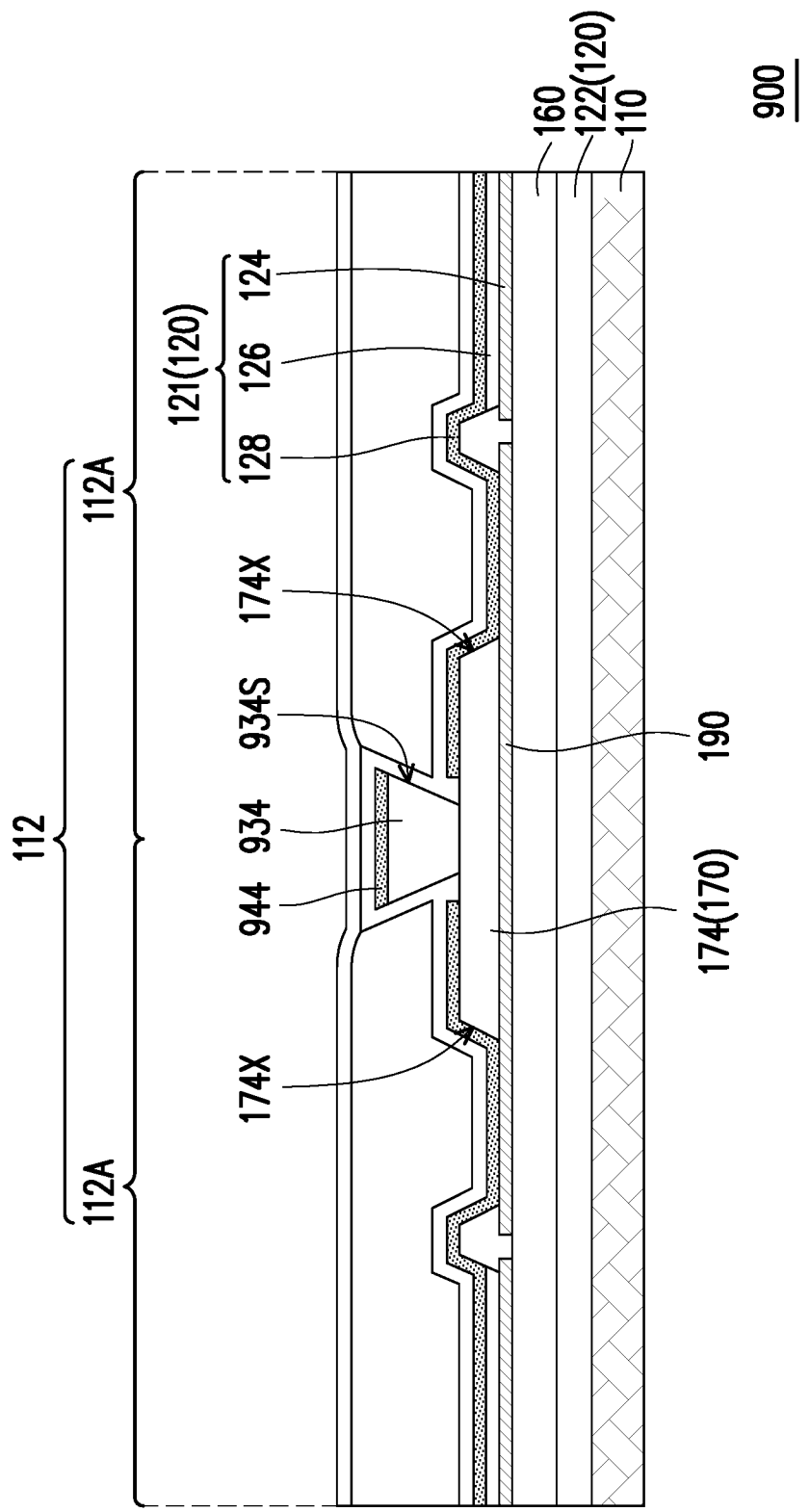
FIG. 19 is a schematic view of an embodiment of a cross-section of a transparent display device 900 taken along line F-F.

In the embodiment where the design of the cross-sectional structure of the transparent display device 900 taken along line E-E is similar to the design shown in FIG. 2, the transparent display device 900 further includes the barrier multi-layer structure 150, the planarization protecting layer 160 and the pixel defining layer 170. In the embodiment, the barrier multi-layer structure 150, the planarization protecting layer 160 and the pixel defining layer 170 are substantially the same as the barrier multi-layer structure 150, the planarization protecting layer 160 and the pixel defining layer 170 as shown in FIG. 2. Therefore, the previous embodiment may serve as reference to facilitate understanding of the structural design and configuration relationship of the elements. At this time, a schematic view of an embodiment of a cross-section of the transparent display device 900 taken along line F-F may be as shown in FIG. 19. FIG. 18 and FIG. 19 show that the second wall structure 934 is stacked on the separating portion 174 of the pixel defining layer 170, and the second wall structure 934 crosses over the entire light emitting region 112 to divide in the light emitting region 112 into an independent sub-region 112A. FIG. 19 shows that the second wall structure 934 has an undercut sidewall 934S, and the second electrode 128 of each of the sub-regions 112A is separated from the second top conductive pattern 944 on the top surface of the second wall structure 934 via the undercut sidewall 934S. In this manner, the second electrodes 128 in different sub-regions 112A are not continuous but separated by the second wall structure 934.

In the embodiment, the separating portion 174 of the pixel defining layer 170 may have a plurality of conductive vias 174X, and the conductive vias 174X are respectively located in two sub-regions 112A on two opposite sides of the second wall structure 934. The second electrode transmission line 190 is further disposed between the pixel defining layer 170 and the planarization protecting layer 160, and the area of the conductive via 174X overlaps the area of the second electrode transmission line 190. The second electrode 128 is filled into the conductive via 174X and electrically connected with the second electrode transmission line 190. In this manner, the second electrode transmission line 190 may electrically connect the second electrodes 128 in the two adjacent sub-regions 112A together to transmit the signal of the second electrode 128.

In the embodiment, the first top conductive pattern 140 is distributed along the first wall structure 130 and the second top conductive pattern 944 is distributed along the second wall structure 934 to construct a grid conductive pattern, and the first top conductive pattern 140 and the second top conductive pattern 944 may serve as touch sensing electrode without being electrically connected with other conductive structure such as the second electrodes 128. The transparent display device 900 can adopt existing patterned top conductive layer 940 to realize touch sensing function without additional related conductive layer for touch sensing. In other embodiments, the barrier multi-layer structure 150 of the transparent display device 900 may be replaced by any one of the barrier multi-layer structures 250 and 350 in FIG. 4 and FIG. 5; alternatively, the inorganic protecting layer 402 as shown in FIG. 6 may be added between the barrier multi-layer structure 150 and the pixel defining layer 170.

Figure 20:
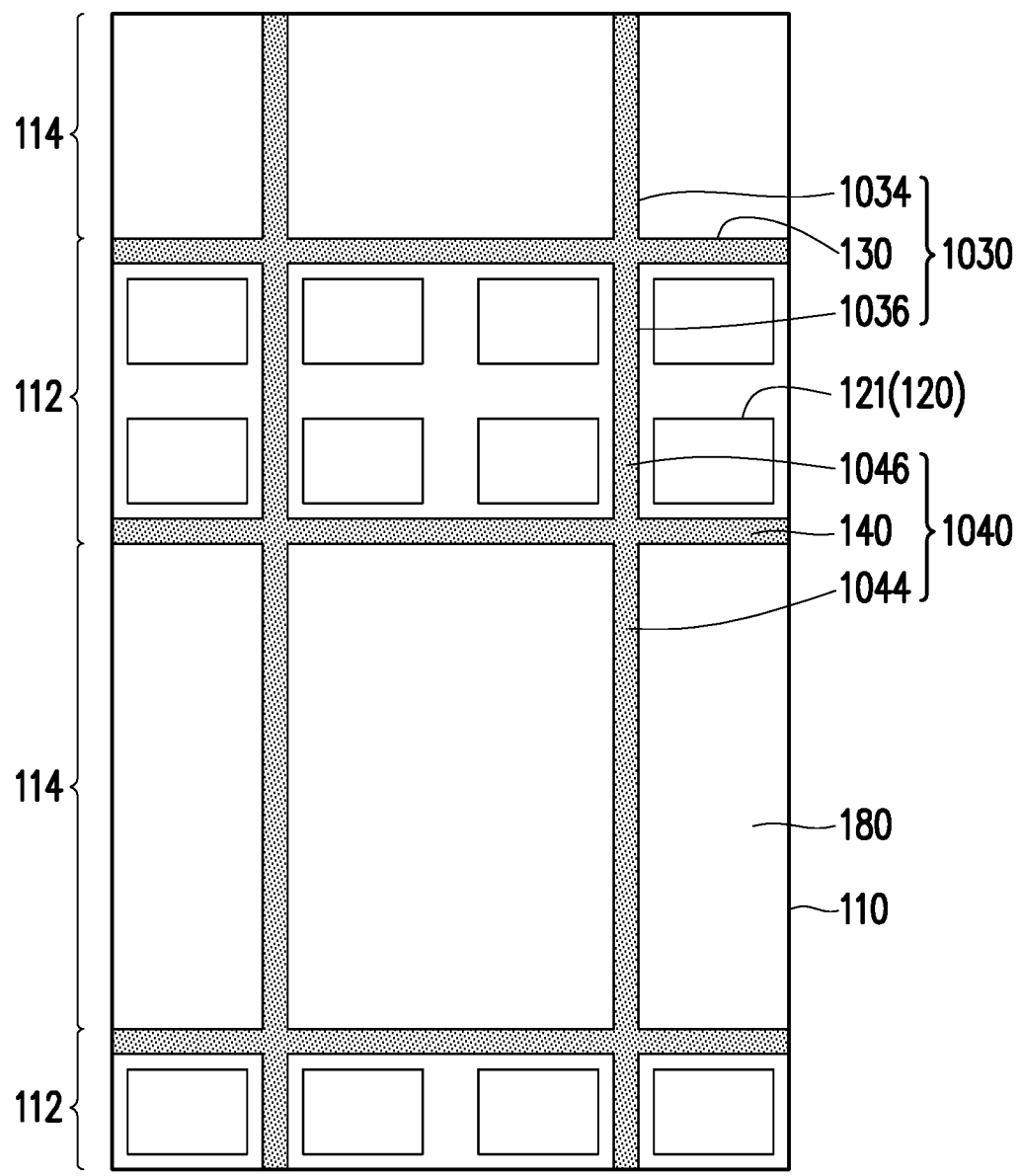
FIG. 20 is a top view of a portion of a transparent display device according to an embodiment of the disclosure.

FIG. 20 is a top view of a portion of a transparent display device according to an embodiment of the disclosure. Referring to FIG. 20, a transparent display device 1000 includes a substrate 110, a light emitting element 120, a wall structure 1030, a patterned top conductive layer 1040 and a light transmitting region conductive layer 180. The light emitting element 120 and the wall structure 1030 are disposed on the substrate 110. The patterned top conductive layer 1040 is disposed on the top surface of the wall structure 1030. The patterned top conductive layer 1040 in FIG. 20 may overlap the wall structure 1030, and FIG. 20 is illustrated with fine dot pattern to represent the area of the patterned top conductive layer 1040. The light emitting element 120 is disposed in the light emitting region 112 and located in the light emitting region 112 surrounded by the wall structure 1030. The light transmitting region conductive layer 180 is disposed in the light transmitting region 114. Additionally, the embodiment exemplifies that the light emitting element 120 includes a plurality of organic light emitting structures 121. However, in other embodiment, the light emitting element 120 may be a single organic light emitting structure 121. In the embodiment, the light transmitting region 114 is provided without the barrier multi-layer structure 150, which facilitates to improve the visible light transmittance of the transparent display device 1000 in the light transmitting region 114 such that the transparency of the transparent display device 1000 is enhanced.

In the embodiment, the wall structure 1030 includes a first wall structure 130, a second wall structure 1034 and a third wall structure 1036. The first wall structure 130 may surround the light emitting element 120 and separate the substrate 110 into the light emitting region 112 and the light transmitting region 114, and define the boundary between the light transmitting region 114 and the light emitting region 112. In other words, the layout of the first wall structure 130 in the top view is substantially the same as the first wall structure 130 described in the previous embodiment. The second wall structure 1034 is disposed in the light transmitting region 114 and connected with the first wall structure 130 to construct a grid in the light transmitting region 114. The third wall structure 1036 is located in the light emitting region 112 and connected with the first wall structure 130 to construct a grid in the light emitting region 112.

Additionally, the patterned top conductive layer 1040 may include a portion arranged along the top surface of the first wall structure 130 to construct a first top conductive pattern 140, a portion arranged along the top surface of the second wall structure 1034 to construct a second top conductive pattern 1044 and a portion arranged along the top surface of the third wall structure 1036 to construct a third top conductive pattern 1046. In other words, the patterned top conductive layer 1040 in both of the light emitting region 112 and the light transmitting region 114 construct the conductive grid pattern.

The first wall structure 130, the second wall structure 1034 and the third wall structure 1036 may respectively have the cross-sectional structure of the first wall structure 130, the second wall structure 834 and the second wall structure 934 as described in the previous embodiment. In other words, the first wall structure 130, the second wall structure 1034 and the third wall structure 1036 have undercut sidewall. In this manner, the first top conductive pattern 140, the second top conductive pattern 1044 and the third top conductive pattern 1046 of the patterned top conductive layer 1040 are not connected with the light transmitting region conductive layer 180 or the electrode layer in the light emitting element 120. The transparent display device 1000 may use the grid patterned top conductive layer 1040 as the electrode for touch sensing to realize touch sensing function.

In the previous embodiments, not only the patterned top conductive layer on the top surface of the wall structure can be used as the touch sensing electrode, an additional conductive layer may also be selected to construct a touch sensing electrode.

Figure 21:
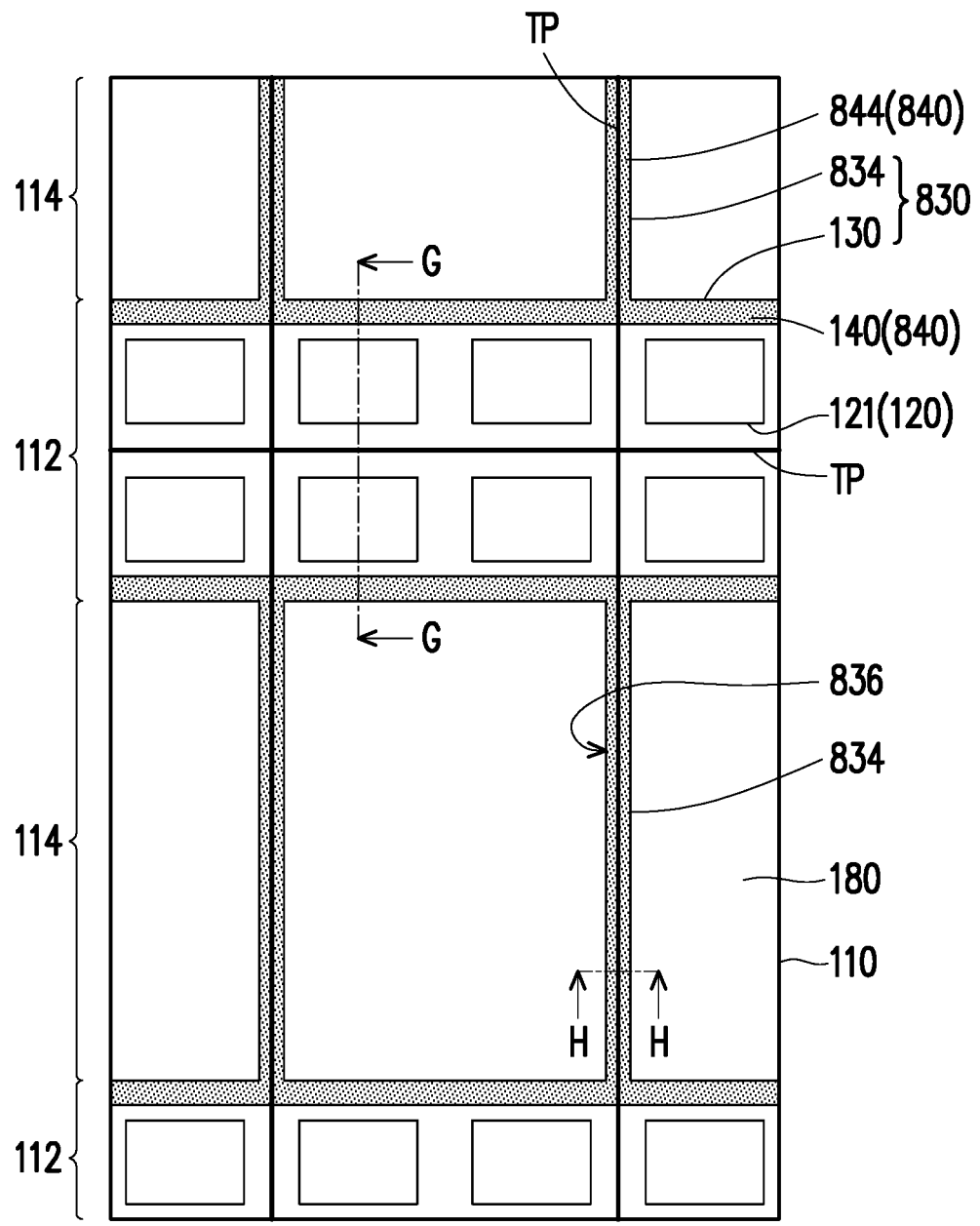
FIG. 21 is a top view of a portion of a transparent display device according to an embodiment of the disclosure.

For example, FIG. 21 is a top view of a portion of a transparent display device according to an embodiment of the disclosure. Referring to FIG. 21, a transparent display device 1100 includes a substrate 110, a light emitting element 120, a first wall structure 130, a second wall structure 834, a first top conductive pattern 140, a second top conductive pattern 844, a light transmitting region conductive layer 180 and a touch-sensing circuit TP; FIG. 10 and related descriptions may serve as reference to facilitate understanding of the structural design and configuration of the substrate 110, the light emitting element 120, the first wall structure 130, the second wall structure 834, the first top conductive pattern 140, the second top conductive pattern 844 and the light transmitting region conductive layer 180; thus, the related descriptions are not reiterated herein. The embodiment is a realization that the touch-sensing circuit TP is disposed on the transparent display device 800 in FIG. 10. The touch-sensing circuit TP may have a grid layout, distributed along the second wall structure 834 in the light transmitting region 114, and distributed along a portion of the boundary of the organic light emitting structure 121 of the light emitting element 120 in the light emitting region 112. The touch-sensing circuit TP distributed along the second wall structure 834 may be extended into the light emitting region 112 and cross over the light emitting region 112. The touch-sensing circuit TP that is distributed along a portion of the boundary of the organic light emitting structure 121 of the light emitting element 120 may be substantially parallel with the first wall structure 130.

Figure 22:
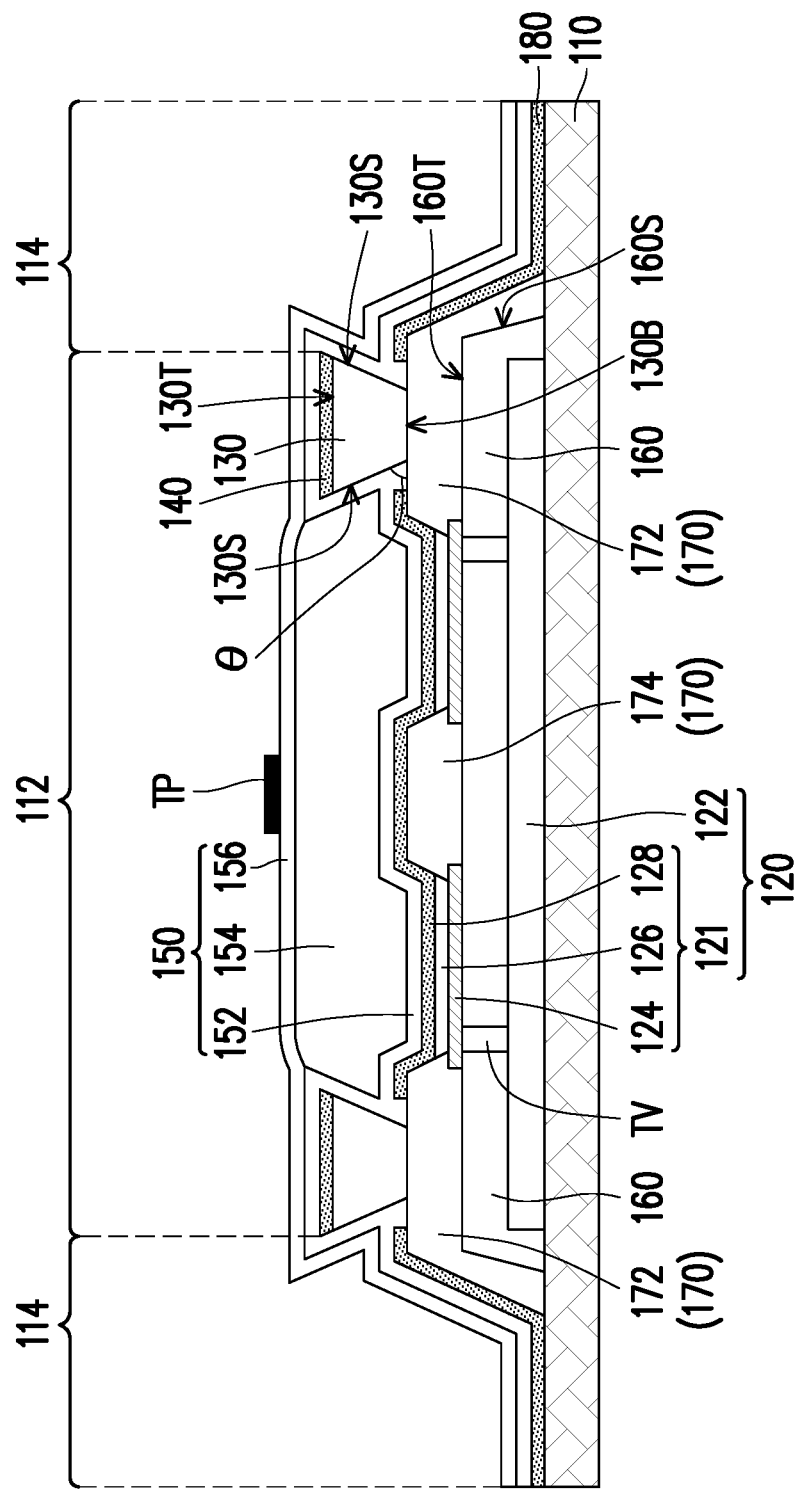
FIG. 22 is a schematic view of an embodiment of a cross-sectional structure of the transparent display device in FIG. 21 taken along line G-G.

FIG. 22 is a schematic view of an embodiment of a cross-sectional structure of the transparent display device in FIG. 21 taken along line G-G. FIG. 21 and FIG. 22 show that, in the embodiment, the transparent display device 1100 further includes the barrier multi-layer structure 150, the planarization protecting layer 160 and the pixel defining layer 170. In the embodiment, the barrier multi-layer structure 150, the planarization protecting layer 160 and the pixel defining layer 170 are substantially the same as the barrier multi-layer structure 150, the planarization protecting layer 160 and the pixel defining layer 170 shown in FIG. 2. Therefore, the previous embodiment may serve as reference to facilitate understanding of the structural design and configuration relationship of the elements.

In the embodiment, the barrier multi-layer structure 150 includes the first barrier layer 152, the second barrier layer 154 and the third barrier layer 156 stacked on the substrate 110 in sequence, and the overlapping portion of the first barrier layer 152, the second barrier layer 154 and the third barrier layer 156 is located in the light emitting region 112. The touch-sensing circuit TP is disposed on the third barrier layer 156, and the touch-sensing circuit TP may be distributed along at least a portion (e.g., a separating portion 174 that separates different light emitting diode elements) of the pixel defining layer 170. However, in other embodiment, the layout of the touch-sensing circuit TP may be subject to different requirement. Additionally, the touch-sensing circuit TP may be applied to the transparent display device 100 in FIG. 1, the transparent display device 900 in FIG. 18 or the transparent display device 1000 in FIG. 20.

Figure 23:
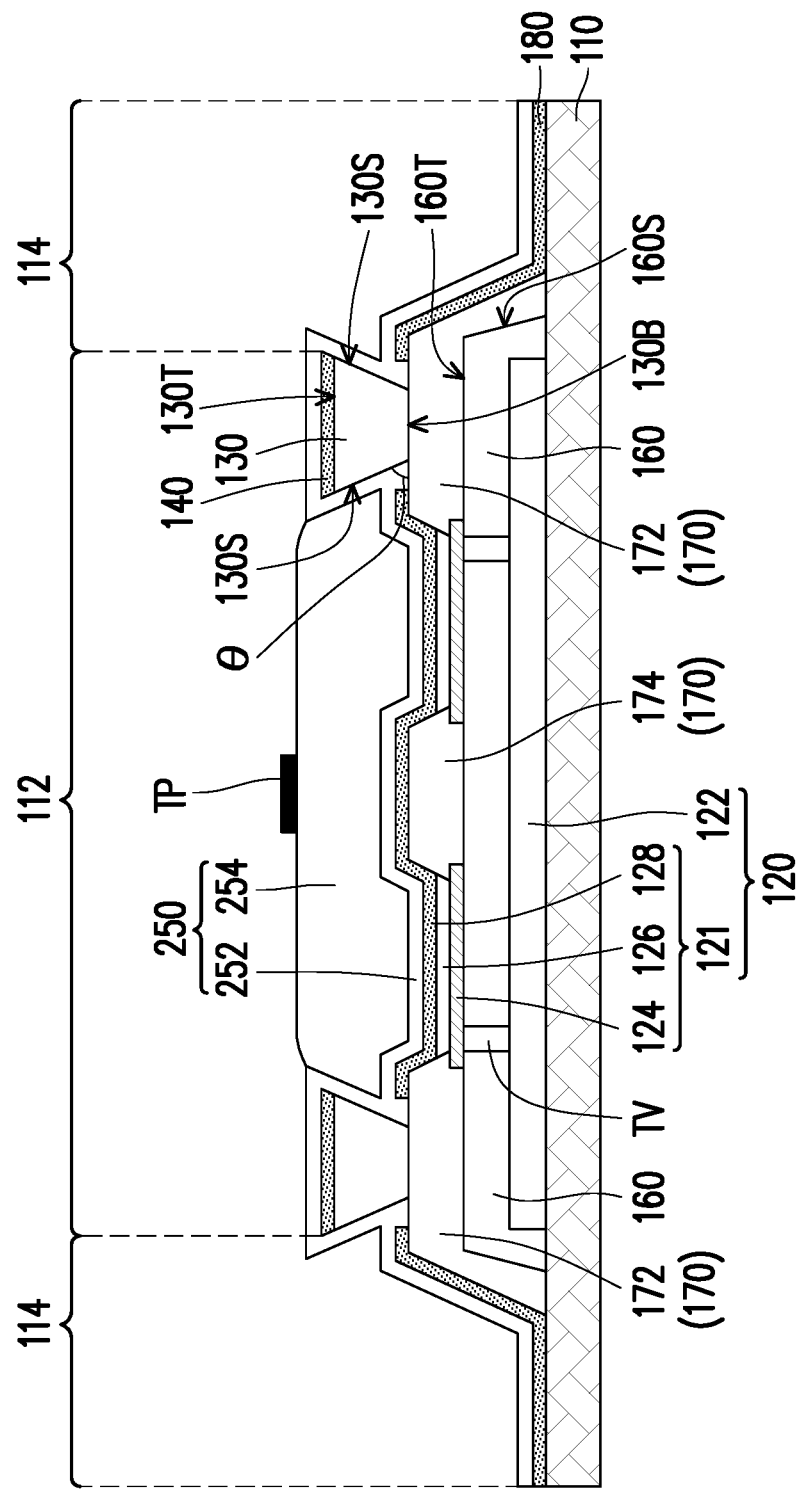
FIG. 23 is a schematic view of an embodiment of a cross-sectional structure of the transparent display device in FIG. 21 taken along line G-G.

FIG. 23 is a schematic view of an embodiment of a cross-sectional structure of the transparent display device in FIG. 21 taken along line G-G. FIG. 21 and FIG. 23 show that, in the embodiment, the transparent display device 1100 further includes the barrier multi-layer structure 250, the planarization protecting layer 160 and a pixel defining layer 170. In the embodiment, the barrier multi-layer structure 250, the planarization protecting layer 160 and the pixel defining layer 170 are substantially the same as the barrier multi-layer structure 250, the planarization protecting layer 160 and the pixel defining layer 170 shown in FIG. 4. Therefore, the previous embodiment may serve as reference to facilitate understanding of the structural design and configuration relationship of the elements.

In the embodiment, the barrier multi-layer structure 250 includes the first barrier layer 252 and the second barrier layer 254 stacked on the substrate 110 in sequence, and the overlapping portion of the first barrier layer 252 and the second barrier layer 254 is located in the light emitting region 112. The touch-sensing circuit TP is disposed on the second barrier layer 254, and the touch-sensing circuit TP may be distributed along at least a portion (e.g., a separating portion 174 that separates different light emitting diode elements) of the pixel defining layer 170. However, in other embodiments, the layout of the touch-sensing circuit TP may be subject to different requirements.

Figure 24:
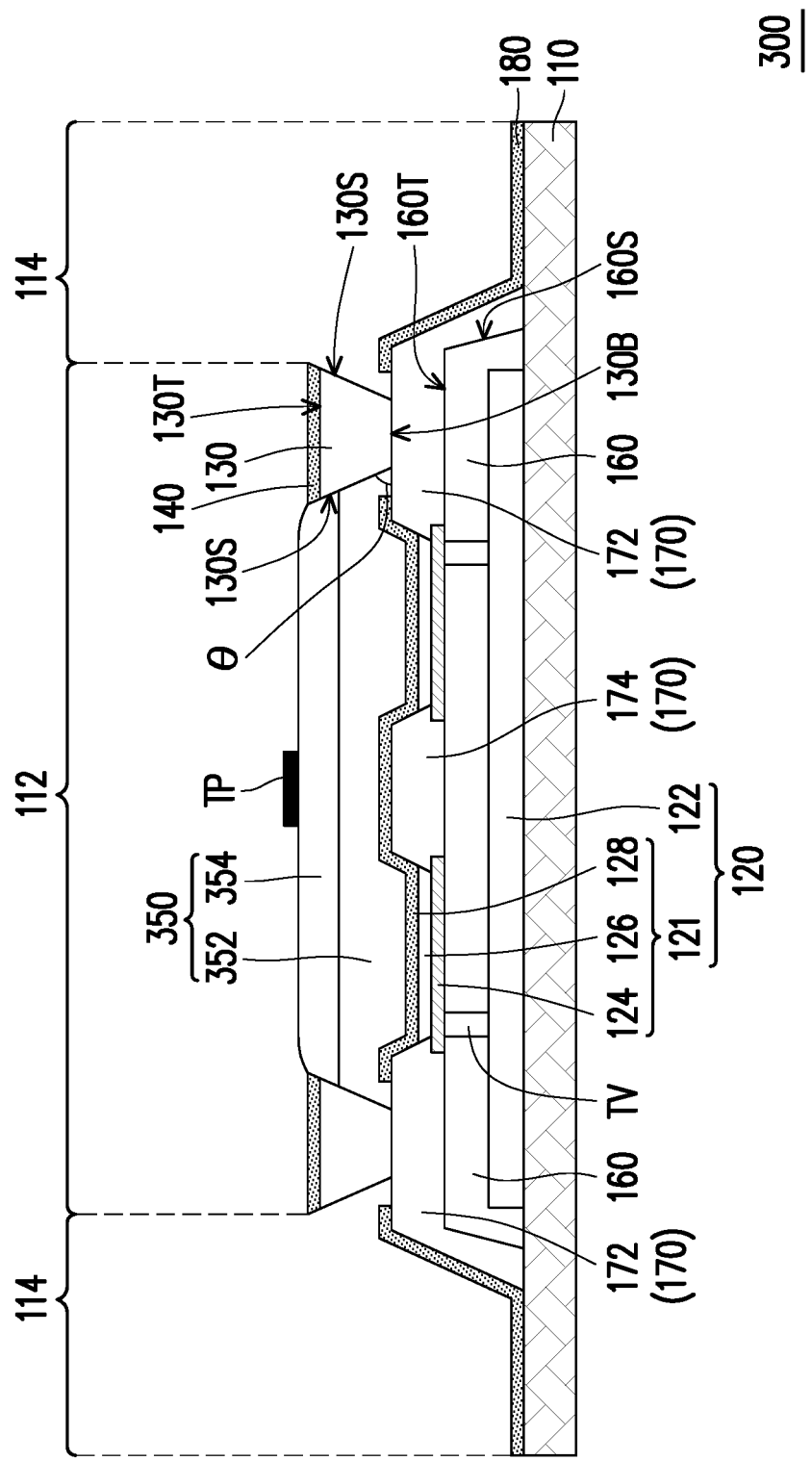
FIG. 24 and FIG. 25 are schematic views of an embodiment of a cross-sectional structure of the transparent display device in FIG. 21 taken along line G-G and line H-H.
Figure 25:
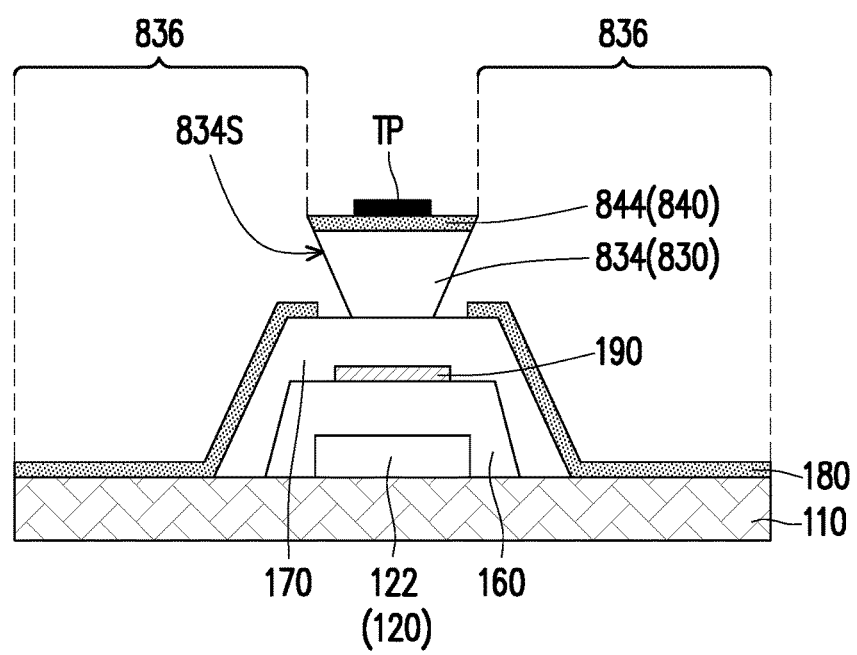

FIG. 24 and FIG. 25 are schematic views of an embodiment of a cross-sectional structure of the transparent display device in FIG. 21 taken along line G-G and line H-H. FIG. 21, FIG. 24 and FIG. 25 show that, in the embodiment, the transparent display device 1100 further includes the barrier multi-layer structure 350, the planarization protecting layer 160, the pixel defining layer 170 and the second electrode transmission line 190. In the embodiment, the barrier multi-layer structure 350, the planarization protecting layer 160, the pixel defining layer 170 and the second electrode transmission line 190 are substantially the same as the barrier multi-layer structure 350, the planarization protecting layer 160, the pixel defining layer 170 and the second electrode transmission line 190 described in FIG. 13. Therefore, the previous embodiment may serve as reference to facilitate understanding of the structural design and configuration relationship of the elements.

In the embodiment, the barrier multi-layer structure 350 includes the first barrier layer 352 and the second barrier layer 354 stacked on the substrate 110 in sequence, and the first barrier layer 352 and the second barrier layer 354 are completely located in the light emitting region 112 surrounded by the first wall structure 130. The touch-sensing circuit TP disposed in the light emitting region 112 is disposed on the second barrier layer 354 of the barrier multi-layer structure 350 (as shown in FIG. 24), disposed on the second top conductive pattern 844 in the light transmitting region 114, and is contact with the second top conductive pattern 844 (as shown n FIG. 25). The touch-sensing circuit TP in FIG. 21 and FIG. 24 may be distributed along at least a portion (e.g., a separating portion 174 that separates different light emitting diode elements) of the pixel defining layer 170. However, in other embodiment, the layout of the touch-sensing circuit TP may be subject to different requirement.

Additionally, the cross-sectional structure of FIG. 22 to FIG. 24 may be realized in alternative manners. For example, the inorganic protecting layer 402 as shown in FIG. 6 may be further disposed between the planarization protecting layer 160 and the pixel defining layer 170. The pixel defining layer 170 may be replaced by the pixel defining layer 570 in FIG. 7. The configuration relationship of the pixel defining layer 170 and the first wall structure 130 may be replaced by the configuration relationship of the pixel defining layer 670 and the first wall structure 630 in FIG. 8. Alternatively, the planarization protecting layer 160 may be replaced by the planarization protecting layer 760 in FIG. 9.

In the transparent display device described in the embodiment of the disclosure, the wall structure is disposed at the boundary between the light emitting region and the light transmitting region, and the wall structure is used to demark at least one barrier layer of the barrier multi-layer structure in the light emitting region. The light transmitting region of the transparent display device can have good visible light transmittance, and provide good moisture and/or oxygen blocking effect in the light emitting region so that the element in the light emitting region is not easily damaged due to invasion of the moisture and/or oxygen from the outside.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A transparent display device, comprising:
   a substrate, having a light emitting region and a light transmitting region;
   a light emitting element, disposed on the substrate, located in the light emitting region;
   a first wall structure, disposed on the substrate, and the first wall structure having an undercut sidewall, wherein the first wall structure is a boundary between the light transmitting region and the light emitting region, and the light emitting element is located in the light emitting region surrounded by the first wall structure;
   a first top conductive pattern, disposed on a top surface of the first wall structure; and
   a barrier multi-layer structure, disposed on the light emitting element, wherein the barrier multi-layer structure comprises a first barrier layer and a second barrier layer, an overlapping portion of the first barrier layer and the second barrier layer is only located within the light emitting region surrounded by the first wall structure.

2. The transparent display device according to claim 1, further comprising a touch-sensing circuit, disposed on the substrate and the touch-sensing circuit in the light emitting region being located on the barrier multi-layer structure.

3. The transparent display device according to claim 1, wherein the light emitting element comprises a driving circuit complex layer, a first electrode, a light emitting layer and a second electrode, the driving circuit complex layer is disposed on the substrate, the first electrode, the light emitting layer and the second electrode are stacked in sequence to construct a light emitting diode, the light emitting diode is disposed on the driving circuit complex layer, and the first electrode is electrically connected with the driving circuit complex layer.

4. The transparent display device according to claim 3, further comprising a second wall structure and a second top conductive pattern, wherein the second wall structure is disposed on the substrate, located in the light emitting region and connected with the first wall structure, and the second top conductive pattern is disposed on a top surface of the second wall structure and distributed along the second wall structure.

5. The transparent display device according to claim 3, further comprising a pixel defining layer, wherein the pixel defining layer has a pixel opening, the light emitting layer is located within the pixel opening, the second electrode continuously covers the light emitting layer and the pixel defining layer, and the pixel defining layer and the light emitting layer are located between the second electrode and the driving circuit complex layer.

6. The transparent display device according to claim 5, further comprising a second electrode transmission line, disposed between the pixel defining layer and the driving circuit complex layer, wherein the pixel defining layer further has a conductive via, the second electrode covers the conductive via to be connected with the second electrode transmission line in the conductive via.

7. The transparent display device according to claim 5, wherein the pixel defining layer comprises an outer periphery portion, the outer periphery portion is distributed extensively along the boundary between the light emitting region and the light transmitting region.

8. The transparent display device according to claim 7, wherein the first wall structure is stacked on the outer periphery portion of the pixel defining layer.

9. The transparent display device according to claim 7, wherein the outer periphery portion of the pixel defining layer is located between the first wall structure and the light emitting element, and a height of the first wall structure is higher than a height of the pixel defining layer.

10. The transparent display device according to claim 5, further comprising a planarization protecting layer, wherein the planarization protecting layer is disposed between the driving circuit complex layer and the first electrode to cover the driving circuit complex layer, and the pixel defining layer is disposed on the planarization protecting layer.

11. The transparent display device according to claim 10, wherein the pixel defining layer further covers a sidewall of the planarization protecting layer.

12. The transparent display device according to claim 10, wherein the planarization protecting layer further covers the light transmitting region.

13. The transparent display device according to claim 10, further comprising an inorganic protecting layer, covering the planarization protecting layer and located between the pixel defining layer and the planarization protecting layer.

14. The transparent display device according to claim 1, further comprising a light transmitting region conductive layer disposed in the light transmitting region.

15. The transparent display device according to claim 14, further comprising a second wall structure and a second top conductive pattern, the second wall structure disposed on the substrate, located in the light transmitting region and connected with the first wall structure to form a plurality of openings, and the second top conductive pattern disposed on a top surface of the second wall structure and distributed along the second wall structure, wherein the light transmitting region conductive layer is disposed in the openings.

16. The transparent display device according to claim 1, wherein the first barrier layer is located between the second barrier layer and the light emitting element, and the second barrier layer is located in the light emitting region surrounded by the first wall structure.

17. The transparent display device according to claim 16, wherein the barrier multi-layer structure further comprises a third barrier layer, and the second barrier layer is sandwiched between the first barrier layer and the third barrier layer.

18. The transparent display device according to claim 17, wherein the first barrier layer and the third barrier layer are in contact with each other outside the second barrier layer to cover the second barrier layer.

19. The transparent display device according to claim 16, wherein the first barrier layer continuously covers the first undercut sidewall of the first wall structure.

20. The transparent display device according to claim 16, wherein the first barrier layer is located in the light emitting region surrounded by the first wall structure.

* * * * *